(12) United States Patent
Kumano et al.

(10) Patent No.: US 12,457,832 B2
(45) Date of Patent: Oct. 28, 2025

(54) LIGHT EMITTING DEVICE AND DIFFUSION MEMBER USED THEREIN

(71) Applicant: NICHIA CORPORATION, Anan (JP)

(72) Inventors: Masami Kumano, Tokushima (JP); Takahiro Kubo, Anan (JP); Makiko Iwasa, Anan (JP)

(73) Assignee: NICHIA CORPORATION, Anan (JP)

( * ) Notice: Subject to any disclaimer, the term of this patent is extended or adjusted under 35 U.S.C. 154(b) by 576 days.

(21) Appl. No.: 18/051,259

(22) Filed: Oct. 31, 2022

(65) Prior Publication Data

US 2023/0155084 A1 May 18, 2023

(30) Foreign Application Priority Data

Nov. 1, 2021 (JP) ................................. 2021-178946
Jul. 29, 2022 (JP) ................................. 2022-122171

(51) Int. Cl.
*H10H 20/855* (2025.01)
*G02B 5/02* (2006.01)
(Continued)

(52) U.S. Cl.
CPC ......... *H10H 20/855* (2025.01); *G02B 5/0278* (2013.01); *H10H 20/831* (2025.01); *H10H 20/857* (2025.01)

(58) Field of Classification Search
CPC .. H10H 20/855; H10H 20/831; H10H 20/857; H10H 20/882; G02B 5/0278;
(Continued)

(56) References Cited

U.S. PATENT DOCUMENTS

| | | |
|---|---|---|
| 2015/0077982 A1 | 3/2015 | Urano et al. |
| 2015/0137149 A1 | 5/2015 | Urano et al. |

(Continued)

FOREIGN PATENT DOCUMENTS

| | | |
|---|---|---|
| JP | 2002-353516 A | 12/2002 |
| JP | 2007-227791 A | 9/2007 |

(Continued)

*Primary Examiner* — Kretelia Graham
*Assistant Examiner* — Nkechinyere Esiaba
(74) *Attorney, Agent, or Firm* — Global IP Counselors, LLP

(57) ABSTRACT

A light-emitting device includes a substrate, a wiring, a light-emitting element configured to emit light having a main wavelength in a range from 500 nm to 560 nm, and a diffusion member. When chromaticity x and chromaticity y of an emission color of the light-emitting device are measured in each of first and second measurement planes in a range in which an angle at the center of the outer shape is in a range from ±60° with reference to a perpendicular line passing through the center of the diffusion member, an average value α of a difference between a maximum value and a minimum value of a chromaticity difference Δx of the chromaticity x measured in the first measurement plane and a difference between a maximum value and a minimum value of a chromaticity difference Δx of the chromaticity x measured in the second measurement plane is less than 0.0024.

18 Claims, 11 Drawing Sheets
(2 of 11 Drawing Sheet(s) Filed in Color)

(51) Int. Cl.
*H10H 20/831* (2025.01)
*H10H 20/857* (2025.01)

(58) Field of Classification Search
CPC ... G02B 5/0242; H01L 25/0753; H01L 33/50; H01L 33/504
See application file for complete search history.

(56) References Cited

U.S. PATENT DOCUMENTS

| | | |
|---|---|---|
| 2017/0186920 A1 | 6/2017 | Kumano et al. |
| 2020/0309346 A1* | 10/2020 | Iwasa ................. H10H 20/8513 |
| 2021/0231293 A1 | 7/2021 | Iwasa et al. |
| 2023/0005895 A1 | 1/2023 | Ozeki et al. |

FOREIGN PATENT DOCUMENTS

| | | |
|---|---|---|
| JP | 2012-039000 A | 2/2012 |
| JP | 2016-000831 A | 1/2016 |
| JP | 2017-117912 A | 6/2017 |
| JP | 2018-166199 A | 10/2018 |
| JP | 2020-161773 A | 10/2020 |
| JP | 2021-108358 A | 7/2021 |
| WO | 2013179625 A1 | 12/2013 |
| WO | 2020031598 A1 | 2/2020 |

* cited by examiner (a)

(b)

(c)

Main wavelength: 523 nm

No. 1 (0 mass%)

No. 5 (5.0 mass%)

No. 2 (1.0 mass%)

No. 6 (7.5 mass%)

No. 3 (2.0 mass%)

No. 7 (10.0 mass%)

No. 4 (3.0 mass%)

No. 8 (12.5 mass%)

Main wavelength: 470 nm

No. 9 (0 mass%)

No. 13 (5.0 mass%)

No. 10 (1.0 mass%)

No. 14 (7.5 mass%)

No. 11 (2.0 mass%)

No. 15 (10.0 mass%)

No. 12 (3.0 mass%)

LIGHT EMITTING DEVICE AND DIFFUSION MEMBER USED THEREIN

CROSS-REFERENCE TO RELATED APPLICATIONS

The present application is based on, and claims priority from Japanese Application No. 2021-178946 filed on Nov. 1, 2021 and Japanese Application No. 2022-122171 filed on Jul. 29, 2022. The entire disclosures of Japanese Application Nos. 2021-178946 and 2022-122171 are hereby incorporated herein by reference.

TECHNICAL FIELD

The present disclosure relates to a light-emitting device and a diffusion member used therein.

BACKGROUND ART

As a small light-emitting device using a light-emitting diode (LED), a package having approximately the same size as a light-emitting element, a so-called chip scale package (CSP) has been developed in recent years.

As an example of such a light-emitting device, a white light-emitting device including a wavelength conversion member has been proposed, and a plate-shaped wavelength conversion member containing a phosphor is disposed on a light-emitting element provided on a substrate (for example, JP 2017-117912 A).

Another example of a light-emitting device having a similar structure is known as a light-emitting device including a light transmissive member (for example, JP 2021-108358 A). JP 2021-108358 A discloses a light transmissive member having a diffusion effect, for example, a diffusion member including a diffusion material.

As light-emitting devices other than the white light-emitting device, for example, blue light-emitting devices and green light-emitting devices use blue light-emitting elements or green light-emitting elements. In recent years, the demand for color LEDs such as blue light-emitting devices and green light-emitting devices is expected to increase in applications of automotive exterior decoration called Car Body Lighting and applications of communication lamps aimed at transmitting information to the outside of a vehicle during automated driving.

SUMMARY

However, in CSPs emitting green light and blue light, illumination unevenness may occur attributed to the internal structure of the light-emitting device.

Accordingly, an object of an embodiment of the present invention is to provide a light-emitting device with reduced illumination unevenness.

An object of another embodiment of the present invention is to provide a diffusion member suitable for reducing illumination unevenness in a light-emitting device.

A light-emitting device according to a first aspect of the present disclosure is a light-emitting device including a substrate, a wiring formed in the substrate, a light-emitting element including an electrode configured to be electrically connected to the wiring, and a diffusion member disposed on a light-emitting surface side of the light-emitting element on a side opposite to a surface on which the electrode is formed. The light-emitting element has a main wavelength in a range from 500 nm to 560 nm. A first direction parallel to one side of the diffusion member and a second direction orthogonal to the first direction are defined when the diffusion member is viewed in plan view. In each of a first measurement plane passing through a center of an outer shape of the diffusion member when viewed in plan view, being parallel to the first direction, and being perpendicular to a light emission surface of the diffusion member, and a second measurement plane passing through the center of the outer shape, being parallel to the second direction, and being perpendicular to the light emission surface of the diffusion member, in a range in which an angle at the center of the outer shape is in a range from −60° to 60° with reference to a perpendicular line passing through the center of the outer shape, being orthogonal to the light emission surface, and extending in a light emission observation direction, and when chromaticity x and chromaticity y of an emission color of the light-emitting device are measured, an average value α of a difference between a maximum value and a minimum value of a chromaticity difference Δx of the chromaticity x measured in the first measurement plane and a difference between a maximum value and a minimum value of a chromaticity difference Δx of the chromaticity x measured in the second measurement plane is less than 0.0024.

A light-emitting device according to a second aspect of the present disclosure is a light-emitting device including a substrate, a wiring formed in the substrate, a light-emitting element including an electrode configured to be electrically connected to the wiring, and a diffusion member disposed on a light-emitting surface side of the light-emitting element on a side opposite to a surface on which the electrode is formed. The light-emitting element has a main wavelength in a range from 420 nm to 560 nm. A first direction parallel to one side of the diffusion member and a second direction orthogonal to the first direction are defined when the diffusion member is viewed in plan view. In each of a first measurement plane passing through a center of an outer shape of the diffusion member when viewed in plan view, being parallel to the first direction, and being perpendicular to a light emission surface of the diffusion member, and a second measurement plane passing through the center of the outer shape, being parallel to the second direction, and being perpendicular to the light emission surface of the diffusion member, in a range in which an angle at the center of the outer shape is in a range from −60° to 60° with reference to a perpendicular line passing through the center of the outer shape, being orthogonal to the light emission surface, and extending in a light emission observation direction, and when chromaticity x and chromaticity y of an emission color of the light-emitting device are measured, an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane is less than 30% of an average value β' obtained by measuring an emission color of a light-emitting device including a transparent member instead of the diffusion member.

A light-emitting device according to a third aspect of the present disclosure is a light-emitting device including a substrate, a wiring formed in the substrate, a light-emitting element including an electrode configured to be electrically connected to the wiring, and a diffusion member disposed on a light-emitting surface side of the light-emitting element on a side opposite to a surface on which the electrode is formed. The light-emitting element has a main wavelength in a range from 420 nm to 560 nm. A first direction parallel to one side of the diffusion member and a second direction orthogonal to the first direction are defined when the diffusion member is viewed in plan view. In each of a first measurement plane passing through a center of an outer shape of the diffusion member when viewed in plan view, being parallel to the first direction, and being perpendicular to a light emission surface of the diffusion member, and a second measurement plane passing through the center of the outer shape, being parallel to the second direction, and being perpendicular to the light emission surface of the diffusion member, in a range in which an angle at the center of the outer shape is in a range from −60° to 60° with reference to a perpendicular line passing through the center of the outer shape, being orthogonal to the light emission surface, and extending in a light emission observation direction, and when chromaticity x and chromaticity y of an emission color of the light-emitting device are measured, an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane satisfies formula (1) below, $$\beta < 0.0006 y_0 + 0.0006 \quad (1)$$

in formula (1) above, $y_0$ is the chromaticity y of the emission color of the light-emitting device measured on the perpendicular line passing through the center of the outer shape, being orthogonal to the light emission surface, and extending in a light emission observation direction.

A light-emitting device according to a fourth aspect of the present disclosure is a light-emitting device including a substrate, a wiring formed in the substrate, a light-emitting element including an electrode configured to be electrically connected to the wiring, and a diffusion member disposed on a light-emitting surface side of the light-emitting element on a side opposite to a surface on which the electrode is formed. The light-emitting element has a main wavelength in a range from 420 nm to 480 nm. A first direction parallel to one side of the diffusion member and a second direction orthogonal to the first direction are defined when the diffusion member is viewed in plan view. In each of a first measurement plane passing through a center of an outer shape of the diffusion member when viewed in plan view, being parallel to the first direction, and being perpendicular to a light emission surface of the diffusion member, and a second measurement plane passing through the center of the outer shape, being parallel to the second direction, and being perpendicular to the light emission surface of the diffusion member, in a range in which an angle at the center of the outer shape is in a range from −60° to 60° with reference to a perpendicular line passing through the center of the outer shape, being orthogonal to the light emission surface, and extending in a light emission observation direction, and when chromaticity x and chromaticity y of an emission color of the light-emitting device are measured, an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane is less than 0.006.

A diffusion member according to the present disclosure is a diffusion member disposed on a light-emitting surface side of a light-emitting element to diffuse light from the light-emitting element. A first direction parallel to one side of the diffusion member and a second direction orthogonal to the first direction are defined when the diffusion member is viewed in plan view, the diffusion member is disposed on a light-emitting surface of a light-emitting element having a main wavelength of 523 nm to allow light from the light-emitting element to pass through the diffusion member, in each of a first measurement plane passing through a center of an outer shape of the diffusion member when viewed in plan view, being parallel to the first direction, and being perpendicular to a light emission surface of the diffusion member, and a second measurement plane passing through the center of the outer shape, being parallel to the second direction, and being perpendicular to the light emission surface of the diffusion member, in a range in which an angle at the center of the outer shape is in a range from −60° to 60° with reference to a perpendicular line passing through the center of the outer shape, being orthogonal to the light emission surface, and extending in a light emission observation direction, and when chromaticity x and chromaticity y of an emission color of the light passing through the diffusion member are measured, an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane is less than 30% of an average value β' obtained by measuring the emission color of the light from light-emitting element, the light passing through a transparent member disposed on the light-emitting surface of the light-emitting element instead of the diffusion member.

A light-emitting device according to an embodiment of the present invention can reduce illumination unevenness.

A diffusion member according to another embodiment of the present invention is suitable for reducing illumination unevenness in a light-emitting device.

BRIEF DESCRIPTION OF DRAWINGS

The patent or application file contains at least one drawing executed in color. Copies of this patent or patent application publication with color drawing(s) will be provided by the Office upon request and payment of the necessary fee.

DESCRIPTION OF EMBODIMENTS

In a light-emitting device of the present disclosure, it was thought that an emission color of the light-emitting device is the same as an emission color of a light-emitting element and directional chromaticity is constant regardless of a measurement angle. However, when the inventors examined the directional characteristics of the light-emitting device from various viewpoints in order to eliminate illumination unevenness, the inventors discovered that a deviation occurs in chromaticity (chromaticities x and y) due to the measurement angle. When the inventors investigated the relationship between the illumination unevenness and a deviation in chromaticities x and y (chromaticity differences Δx and Δy), the inventors found for the first time that a light-emitting device with little unevenness is attained and completed the invention according to the present disclosure, on the basis of the fact that there is a correlation between a difference between a maximum value and a minimum value of the chromaticity differences Δx and Δy in a range of a measurement angle θ from −60° to 60° and the illumination unevenness, and the fact that the difference between the maximum value and the minimum value of the chromaticity differences Δx and Δy in the angular range is suppressed to less than a predetermined value.

Because the chromaticity differences Δx and Δy are easier to evaluate than the luminance unevenness, they are advantageous as indexes for evaluating and controlling the illumination unevenness.

Therefore, in the embodiments of the present invention, there is provided a light-emitting device that uses the difference between the maximum value and the minimum value of the chromaticity differences Δx and Δy as an index that can appropriately evaluate illumination unevenness, and that reduces the illumination unevenness on the basis of the index.

The chromaticity difference Δx is mainly suitable as an index of the light-emitting device using a light-emitting element having a main wavelength in a range from 500 nm to 560 nm (green).

The chromaticity difference Δy is mainly suitable as an index of the light-emitting device using a light-emitting element having a main wavelength in a range from 420 nm to 560 nm (blue to green), particularly, a light-emitting element having a main wavelength in a range from 420 nm to 480 nm (blue).

A light-emitting device according to the embodiments is described below with reference to the drawings.

First Embodiment: Light-Emitting Device

In the first embodiment, a light-emitting device using a light-emitting element having a main wavelength in a range from 500 nm to 560 nm (green) is defined by the chromaticity difference Δx.

Figure 1:
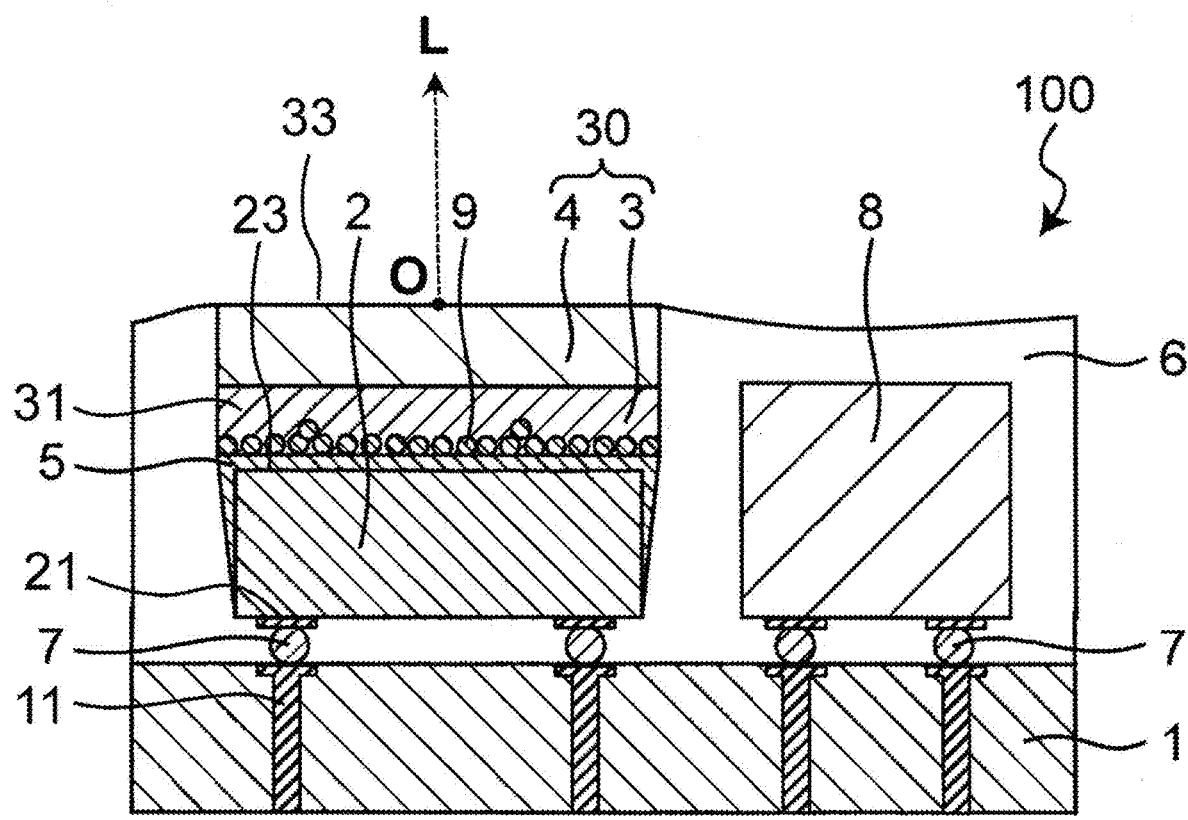
FIG. 1 is a schematic cross-sectional view of a light-emitting device according to a first embodiment of the present invention.
Figure 1:
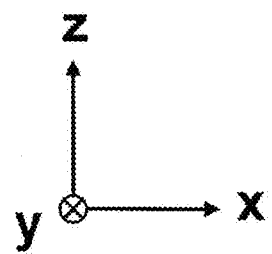
Figure 2:
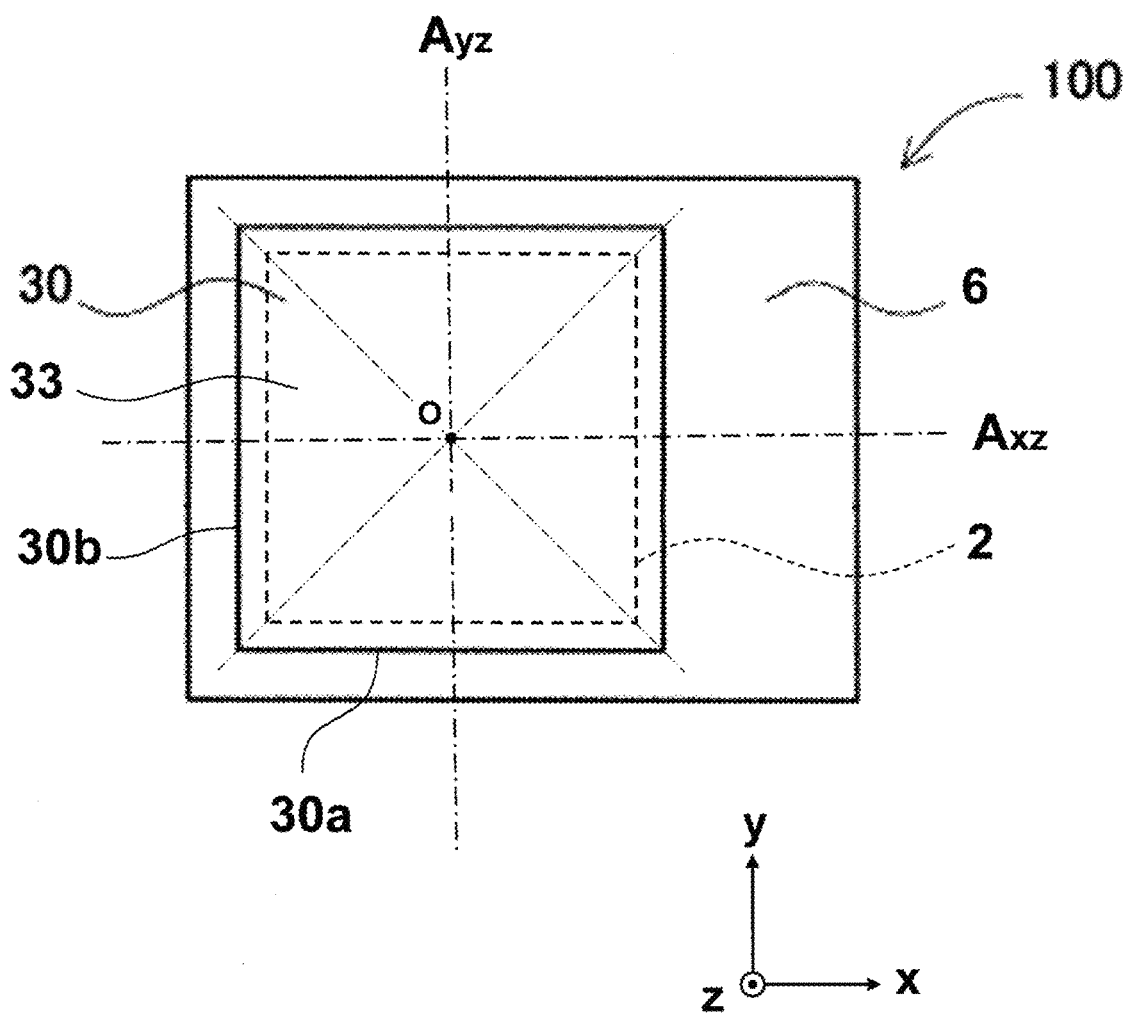
FIG. 2 is a schematic top view of the light-emitting device according to the first embodiment of the present invention.

A light-emitting device 100 illustrated in FIGS. 1 and 2 includes a substrate 1, a light-emitting element 2 mounted on the substrate 1, and a diffusion member 30 (including a diffusion layer 3 and a light-transmitting body 4) disposed on the light-emitting element 2. A wiring 11 is formed in the substrate 1. An electrode 21 is formed on a lower surface of the light-emitting element 2. The light-emitting element 2 may be flip-chip mounted on the substrate 1 via a conductive member 7. As a result, the electrode 21 of the light-emitting element 2 is electrically connected to the wiring 11 of the substrate 1 via the conductive member 7.

The light-emitting element 2 has a main wavelength in a range from 500 nm to 560 nm.

An upper surface of the light-emitting element 2 (that is, a surface opposite to a surface on which the electrodes 21 are formed) is a light-emitting surface 23. A diffusion member 30 is disposed on the light-emitting surface 23 side of the light-emitting element 2. The diffusion member 30 may be bonded to the light-emitting element 2 via an adhesive layer 5. The light-emitting device 100 may include a covering member 6 disposed along lateral surfaces of the light-emitting element 2, the diffusion layer 3, and the light-transmitting body 4.

An upper surface of the diffusion member 30 (surface opposite to a surface facing the light-emitting element 2) is a light emission surface 33. Light emitted from the light-emitting surface 23 of the light-emitting element 2 passes through the diffusion member 30 and is extracted to the outside from the light emission surface 33.

The light-emitting device 100 may include a semiconductor element 8 flip-chip mounted on the substrate 1 via the conductive member 7. The semiconductor element 8 may be omitted as necessary.

The light-emitting device 100 has a characteristic whose directional chromaticity in a specific measurement plane is extremely uniform.

A method of measuring the directional chromaticity is described in detail.

The directional chromaticity is measured in each of two measurement planes (first measurement plane Axz and second measurement plane Ayz).

First, when the diffusion member 30 is viewed in plan view, a first direction x parallel to one side (first side 30a) of the diffusion member 30 and a second direction y orthogonal to the first direction x are defined.

The first measurement plane Axz is a measurement plane parallel to an xz plane, and is a plane that (i) passes through the center of an outer shape of the diffusion member 30 when viewed in plan view, (ii) is parallel to the first direction x parallel to the first side 30a of the diffusion member 30, and (iii) is perpendicular to the light emission surface 33 of the diffusion member 30.

The second measurement plane Ayz is a measurement plane parallel to a yz plane, and is a plane that (i) passes through the center of the outer shape of the diffusion member 30 when viewed in plan view, (ii) is parallel to the second direction y, and (iii) is perpendicular to the light emission surface 33 of the diffusion member 30.

The expression "center of the outer shape of the diffusion member 30 when viewed in plan view" refers to that for example, as illustrated in FIG. 2, in the case in which the diffusion member 30 when viewed in plan view is rectangular, an intersection point O of diagonal lines is the center of the outer shape of the diffusion member 30. In a case in which the diffusion member 30 has another polygonal shape, when all diagonal lines intersect at one point, an intersection point of the diagonal lines is the center of the outer shape. When not all the diagonal lines intersect at one point, the center of a circumscribed circle of the outer shape is the center of the outer shape.

The expression "one side (first side 30a) of the diffusion member 30" refers to any one side when the diffusion member 30 is viewed in plan view. In the case of the rectangular diffusion member 30 as illustrated in FIG. 2, the first side 30a is any one of four sides of the diffusion member 30. In the light-emitting device 100 of FIG. 2, the first side 30a is a side extending in the x direction, but is not limited to the side extending in the x direction. When the outer shape of the diffusion member 30 has a rectangular shape, the first side 30a may be either a long side or a short side. In the case of a polygonal shape, the first side 30a may be any side that forms the polygon.

The first direction x is a direction parallel to the first side 30a. The second direction is a direction orthogonal to the first direction x, that is, the y direction when the diffusion member 30 is viewed in plan view. Because the diffusion member 30 illustrated in FIG. 2 is rectangular when viewed in plan view, a second side 30b orthogonal to the first side 30a of the diffusion member 30 is parallel to the second direction y.

The second direction y does not need to be parallel to any side of the diffusion member 30. When the diffusion member 30 has a polygonal shape other than a rectangular shape (for example, hexagonal shape), the diffusion member 30 may not have a side orthogonal to an arbitrarily selected one side (first side). In such a case, none of the sides of the diffusion member 30 are parallel to the second direction y.

The expression "surface perpendicular to the light emission surface 33 of the diffusion member 30" refers to a surface orthogonal to the light emission surface 33 (plane parallel to an xy plane in FIGS. 1 to 3), for example, the xz plane and the yz plane.

Figure 3:
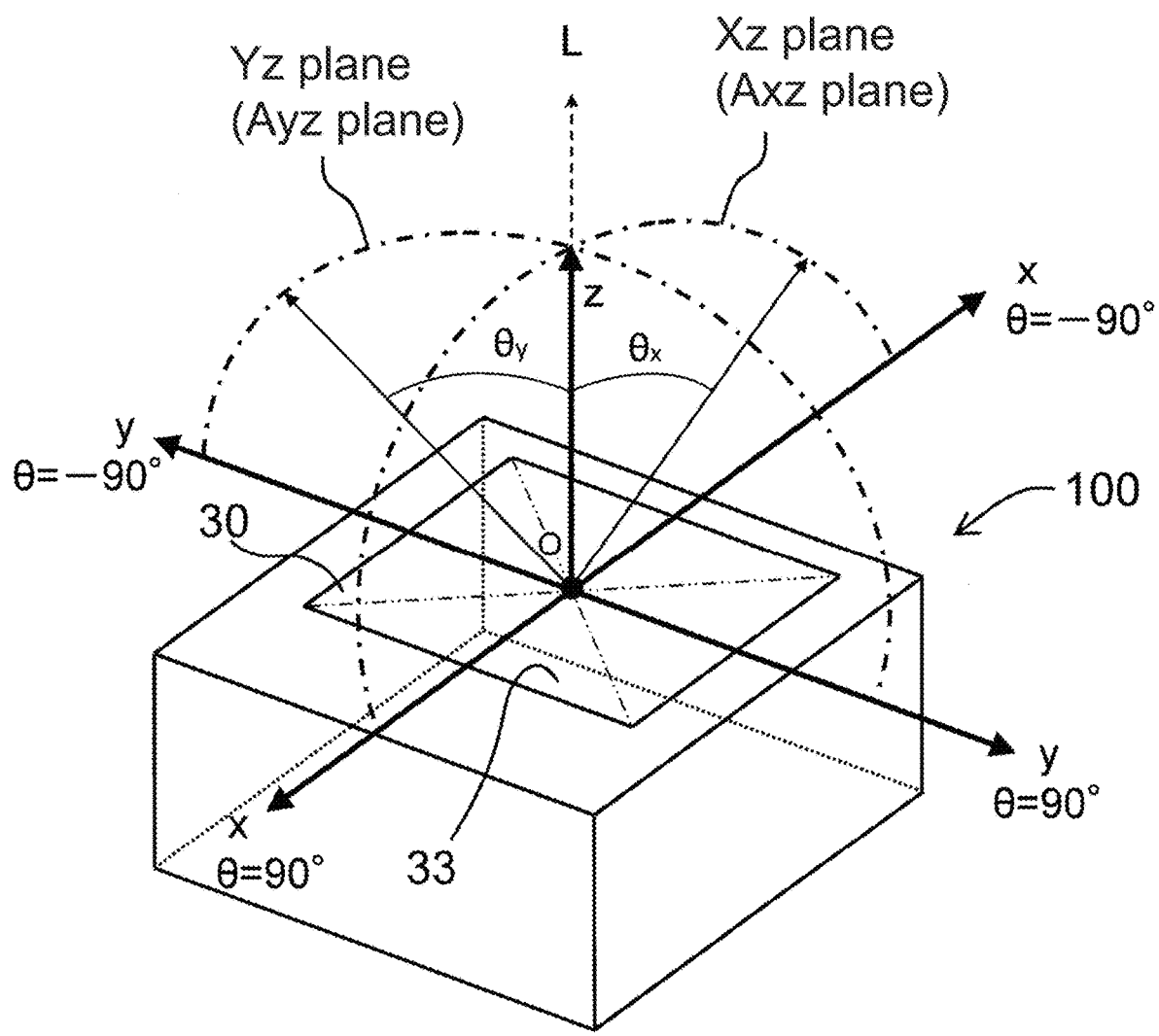
FIG. 3 is a schematic perspective view illustrating directions for measuring directional chromaticity.

Based on these definitions, in the light-emitting device 100 illustrated in FIGS. 1 to 3, the two measurement planes (the first measurement plane and the second measurement plane) are planes that pass through the intersection point O and are parallel to the xz plane and the yz plane, that is, the Axz plane and the Ayz plane.

Although the first measurement plane is the Axz plane and the second measurement plane is the Ayz plane in this specification, the Axz plane and the Ayz plane may be replaced with each other.

The directional chromaticity is measured in a range, in which an angle θ at the center (intersection point O) of the outer shape is in a range from −60° to 60°, with reference to a perpendicular line L (FIGS. 1 and 3) that extends from the center (intersection point O) of the outer shape in a light emission observation direction (z direction) and is orthogonal to the light emission surface 33 of the diffusion member 30.

Specifically, in the measurement in the first measurement plane Axz, the directional chromaticity is measured in a range in which an angle $\theta_x$ at the center (intersection point O) of the outer shape is in a range from −60° to 60° with reference to the perpendicular line L, that is, a fan-shaped range of 120° with the intersection point O as the center. Similarly, in the measurement in the second measurement plane Ayz, the directional chromaticity is measured in a range in which the angle $\theta_y$ at the center (intersection point ( ) of the outer shape is in a range from −60° to 60° with reference to the perpendicular line L, that is, a fan-shaped range of 120° with the intersection point O as the center. The perpendicular line L is parallel to an optical axis of the light-emitting device 100.

On each of the first measurement plane Axz and the second measurement plane Ayz, the chromaticity x and the chromaticity y of an emission color of the light-emitting device 100 are measured in the above measurement range.

When measuring the directional chromaticity (light distribution chromaticity), after a current of 1000 mA is applied to the light-emitting device to emit light, the emission color is measured using a spectral distribution measurement device under the condition of Condition B which is "average LED light intensity" measurement recommended by the Commission Internationale de l'Eclairage (CIE), while changing the measurement direction by rotating an LED using a goniometer. To evaluate the emission color, an x value and a y value based on the CIE color system were used. Regarding the x value, the chromaticity of the emission color at θ=0° is set as a reference value $x_0$, and the directional chromaticity of the light-emitting device is evaluated by calculating a difference between a maximum value and a minimum value of a deviation (chromaticity difference Δx) from the reference value $x_0$ for each measurement.

In the light-emitting device 100 according to the first embodiment, a difference (referred to as $\Delta x_1$) between a maximum value and a minimum value of the chromaticity difference Δx in the first measurement plane Axz and a difference (referred to as $\Delta x_2$) between a maximum value and a minimum value of the chromaticity difference Δx in the second measurement plane Ayz are obtained, and an average value α of $\Delta x_1$ and $\Delta x_2$, that is, $(\Delta x_1 + \Delta x_2)/2$ is controlled to be less than 0.0024. By keeping the average value α of $\Delta x_1$ and $\Delta x_2$ low, the light-emitting device 100 with less illumination unevenness can be attained.

In a light-emitting device using no wavelength conversion member, because the chromaticity difference Δx substantially does not occur, it was thought that there are no differences $\Delta x_1$ and $\Delta x_2$ between the maximum value and the minimum value of the chromaticity difference Δx. Nevertheless, the reason why the chromaticity difference Δx occurs and at least one of $\Delta x_1$ and $\Delta x_2$ is 0.0024 or more is not clear in a light-emitting devices where illumination unevenness actually occurs, but the reason is presumed as follows.

Because more current flows in the vicinity of the electrode 21 of the light-emitting element 2, light with a short wavelength is emitted, but the current flows slightly less at a position further away from the electrode 21 of the light-emitting element 2, and light with a long wavelength is emitted. Therefore, chromaticity unevenness occurs so as to correspond to the pattern of electrodes 21 of the light-emitting element 2.

Because the illumination pattern of the light-emitting device 100 is affected by the electrode pattern of the light-emitting element 2, it is presumed that the illumination pattern has a strong correlation with chromaticity unevenness similarly affected by the electrode pattern of the light-emitting element 2.

In an example of the emission color of the light-emitting device 100, the chromaticity x is in a range from 0.04 to 0.25 and the chromaticity y is in a range from 0.45 to 0.77. The emission color in the chromaticity range corresponds to green.

Second Embodiment: Light-Emitting Device

A light-emitting device 100 according to the second embodiment is the same as the light-emitting device according to the first embodiment except for the type of light-emitting element used in the light-emitting device 100 and the index used for measuring the directional chromaticity. In the second embodiment, differences from the first embodiment are mainly described.

In the second embodiment, a light-emitting device using a light-emitting element having an emission peak wavelength in a range from 420 nm to 560 nm (blue to green) and a light-emitting device using a light-emitting element having an emission peak wavelength in a range from 420 nm to 480 nm (blue) are defined by the chromaticity difference $\Delta y$. As will be described below, the chromaticity difference $\Delta y$ is particularly preferable as an index of a light-emitting device using a light-emitting element having an emission peak wavelength range from 420 nm to 480 nm.

The second embodiment may include three modes (first mode to third mode). Each mode has a different method of determining a reference value of an index for reducing illumination unevenness of a light-emitting device.

(1) First Mode

The light-emitting device 100 according to the first mode of the second embodiment includes the substrate 1, the light-emitting element 2 mounted on the substrate 1, and the diffusion member 30 (including the diffusion layer 3 and the light-transmitting body 4) disposed on the light-emitting element 2, as in the first embodiment (see FIG. 1). The light-emitting element 2 has a main wavelength in a range from 420 nm to 560 nm.

The directional chromaticity is measured on each of the two measurement planes (first measurement plane Axz and second measurement plane Ayz) according to the directional chromaticity measurement method described in detail in the first embodiment. The directional chromaticity is measured in a range, in which an angle $\theta$ at the center (intersection point O) of the outer shape is in a range from −60° to 60°, with reference to the perpendicular line L (FIGS. 1 and 3) that extends from the center (intersection point O) of the outer shape in the light emission observation direction (z direction) and that is orthogonal to the light emission surface 33 of the diffusion member 30.

On each of the first measurement plane Axz and the second measurement plane Ayz, the chromaticity x and the chromaticity y of the emission color of the light-emitting device 100 are measured in the above measurement range.

Regarding the y value, the chromaticity of the emission color at $\theta=0°$ is set as a reference value $y_0$, and the directional chromaticity of the light-emitting device is evaluated by calculating a difference between a maximum value and a minimum value of a deviation (chromaticity difference $\Delta y$) from the reference value $y_0$ for each measurement.

In the light-emitting device 100 according to the first mode of the second embodiment, a difference (referred to as $\Delta y_1$) between a maximum value and a minimum value of the chromaticity difference $\Delta y$ in the first measurement plane Axz and a difference (referred to as $\Delta y_2$) between a maximum value and a minimum value of the chromaticity difference $\Delta y$ in the second measurement plane Ayz are obtained, and an average value $\beta$ of $\Delta y_1$ and $\Delta y_2$ is further obtained.

A light-emitting device (comparative light-emitting device) including a transparent member instead of the diffusion member 30 is prepared, and the directional chromaticity is measured in each of the two measurement planes (first measurement plane Axz and second measurement plane Ayz) according to the directional chromaticity measurement method described in detail in the first embodiment.

Regarding the y value of the comparative light-emitting device, the chromaticity of the emission color at $\theta=0°$ is set as a reference value $y'_0$, and the directional chromaticity of the comparative light-emitting device is evaluated by calculating a difference between a maximum value and a minimum value of a deviation (chromaticity difference $\Delta y'$) from the reference value $y'_0$ for each measurement.

A difference (referred to as $\Delta y'_1$) between a maximum value and a minimum value of the chromaticity difference $\Delta y'$ in the first measurement plane Axz and a difference (referred to as $\Delta y'_2$) between a maximum value and a minimum value of the chromaticity difference $\Delta y$ in the second measurement plane Ayz are obtained, and an average value $\beta'$ of $\Delta y'_1$ and $\Delta y'_2$ is further obtained.

In the first mode of the second embodiment, the average value B of the light-emitting device 100 is controlled to be less than 30% of the average value $\beta'$ of the comparative light-emitting device. This makes it possible to attain the light-emitting device 100 with less illumination unevenness.

The comparative light-emitting device including the transparent member may be manufactured, by removing the diffusion member 30 from the light-emitting device 100 including the diffusion member 30 and fixing the transparent member instead of the diffusion member 30, for example.

The first mode of the second embodiment is advantageous in that the light-emitting device 100 including the light-emitting element 2 having a main wavelength in a range from 420 nm to 560 nm can be evaluated by using the average value B obtained from $\Delta y$ as an index, and particularly, the light-emitting device 100 including the light-emitting element 2 having a main wavelength in a range from 420 nm to 480 nm can be evaluated.

When using the average value a obtained from $\Delta x$ as an index of the illumination unevenness (see the first embodiment), in the light-emitting device 100 including the light-emitting element 2 having a wavelength range from 420 nm to 480 nm, there is a less difference in the average value a between a light-emitting device in which the illumination unevenness occurs and a light-emitting device in which the illumination unevenness does not occur. Therefore, the average value a is not suitable as an index in the wavelength range.

On the other hand, when using the average value B obtained from the chromaticity difference $\Delta y$, there is a large difference in the average value $\beta$ between the light-emitting device in which the illumination unevenness occurs and the light-emitting device in which the illumination unevenness does not occur, over the entire wavelength range from 420 nm to 560 nm of the light-emitting element 2. Therefore, in the light-emitting device 100 including the light-emitting element 2 having a wavelength range from 420 nm to 480 nm, it is suitable to use the average value $\beta$ obtained from $\Delta y$ as an index.

(2) Second Mode

A light-emitting device 100 according to the second mode of the second embodiment is different from the light-emitting device 100 according to the first mode in terms of a definition on the average value B of $\Delta y_1$ and $\Delta y_2$. Because the rest is the same as the first mode, details are omitted.

In the light-emitting device 100 according to the second mode of the second embodiment, the average value $\beta$ of the difference $\Delta y_1$ between the maximum value and the minimum value of the chromaticity difference $\Delta y$ in the first measurement plane Axz and the difference $\Delta y_2$ between the maximum value and the minimum value of the chromaticity difference $\Delta y$ in the second measurement plane Ayz is controlled to satisfy Equation (1) below. This makes it possible to attain the light-emitting device 100 with less illumination unevenness.

$$\beta<0.0006y_0+0.0006 \quad (1)$$

In Equation (1) above, $y_0$ is a reference value for the chromaticity y of the emission color at $\theta=0°$. More specifically, $y_0$ is the chromaticity y of the emission color of the light-emitting device 100 measured on the perpendicular line L that passes through the center of the outer shape of the diffusion member 30 of the light-emitting device 100 when viewed in plan view, is orthogonal to the light emission surface of the diffusion member, and extends in the light emission observation direction.

Because the second mode of the second embodiment uses the average value $\beta$ obtained from $\Delta y$ as an index, the second mode is particularly suitable when the main wavelength of the light-emitting element 2 is in a range from 420 nm to 480 nm, as in the first mode.

(3) Third Mode

A light-emitting device 100 according to the third mode of the second embodiment is different from the light-emitting device 100 according to the first mode and the second mode in terms of a definition on the average value $\beta$ of $\Delta y_1$ and $\Delta y_2$. The third mode is limited to the light-emitting device 100 including the light-emitting element 2 having a main wavelength in a range from 420 nm to 480 nm. Because the rest is the same as the first mode and the second mode, details are omitted.

In the light-emitting device 100 according to the third mode of the second embodiment, the average value $\beta$ of the difference $\Delta y_1$ between the maximum value and the minimum value of the chromaticity difference $\Delta y$ in the first measurement plane Axz and the difference $\Delta y_2$ between the maximum value and the minimum value of the chromaticity difference $\Delta y$ in the second measurement plane Ayz is controlled to be less than 0.0006. This makes it possible to attain the light-emitting device 100 with less illumination unevenness.

In an example of the emission color of the light-emitting device 100 according to the first to third modes of the second embodiment, the chromaticity x is in a range from 0.04 to 0.25 and the chromaticity y is in a range from 0.01 to 0.77. The emission color in the chromaticity range corresponds to blue to green.

Third Embodiment: Diffusion Member

In the third embodiment, the diffusion member 30 suitable for the light-emitting device 100 according to the first and second embodiments is described.

As illustrated in FIG. 1, the diffusion member 30 is disposed on the light-emitting surface side of the light-emitting element 2 and diffuses light from the light-emitting element 2. The diffusion member 30 is defined by the chromaticity difference $\Delta y$ calculated from a measurement result of characteristics using the light-emitting element 2 with a specific wavelength (523 nm).

In the measurement, the diffusion member 30 is disposed on the light-emitting surface of the light-emitting element 2 having a main wavelength of 523 nm, and light from the light-emitting element 2 is passed through the diffusion member 30. The directional chromaticity of the light passing through the diffusion member 30 is measured in each of the two measurement planes (first measurement plane Axz and second measurement plane Ayz) according to the directional chromaticity measurement method described in detail in the first embodiment.

The directional chromaticity is measured in a range, in which an angle $\theta$ at the center (intersection point O) of the outer shape is in a range from $-60°$ to $60°$, with reference to the perpendicular line L (FIGS. 1 and 3) that extends from the center (intersection point O) of the outer shape in the light emission observation direction (z direction) and that is orthogonal to the light emission surface 33 of the diffusion member 30.

The chromaticity x and the chromaticity y of the emission color of the light passing through the diffusion member 30 in the above measurement range are measured on each of the first measurement plane Axz and the second measurement plane Ayz.

Regarding the y value, the chromaticity of the emission color at $\theta=0°$ is set as a reference value $y_0$, and the directional chromaticity characteristics of the diffusion member 30 are evaluated by calculating a difference between a maximum value and a minimum value of a deviation (chromaticity difference $\Delta y$) from the reference value $y_0$ for each measurement.

Regarding the light passing through the diffusion member 30, a difference (referred to as $\Delta y_1$) between a maximum value and a minimum value of the chromaticity difference $\Delta y$ in the first measurement plane Axz and a difference (referred to as $\Delta y_2$) between a maximum value and a minimum value of the chromaticity difference $\Delta y$ in the second measurement plane Ayz are obtained, and an average value $\beta$ of $\Delta y_1$ and $\Delta y_2$ is further obtained.

Even regarding light passing through a transparent member instead of the diffusion member 30, the directional chromaticity is measured in each of the two measurement planes (first measurement plane Axz and second measurement plane Ayz) according to the measurement method of the directional chromaticity described in detail in the first embodiment.

Regarding the y value, the chromaticity of the emission color at $\theta=0°$ is set as a reference value $y'_0$, and the directional chromaticity of the light passing through the transparent member is evaluated by calculating a difference between a maximum value and a minimum value of a deviation (chromaticity difference $\Delta y'$) from the reference value $y'_0$ for each measurement.

A difference (referred to as $\Delta y'_1$) between a maximum value and a minimum value of the chromaticity difference $\Delta y'$ in the first measurement plane Axz and a difference (referred to as $\Delta y'_2$) between a maximum value and a minimum value of the chromaticity difference $\Delta y$ in the second measurement plane Ayz are obtained, and an average value $\beta'$ of $\Delta y'_1$ and $\Delta y'_2$ is further obtained.

In the third embodiment, the average value $\beta$ of light passing through the diffusion member 30 is controlled to be less than 30% of the average value $\beta'$ of light passing through the transparent member. As a result, when applied to the light-emitting device 100, the light-emitting device 100 with less illumination unevenness can be attained.

Common to First to Third Embodiments

Details of each component of the light-emitting device 100 of the first and second embodiments that can achieve the directional chromaticity characteristics and the diffusion member of the third embodiment are described.

Substrate

The substrate 1 is a member on which a light-emitting element is disposed, and includes a wiring for electrically connecting the electrode of the light-emitting element 2 and an external electrode. The main material for the substrate 1 is an insulating material and is preferably a material that does not easily transmit light from a light-emitting element and external light. Examples of the material include ceramics such as alumina and aluminum nitride, and resin such as phenol resin, epoxy resin, polyimide resin, BT resin, and polyphthalamide. When the resin is used, inorganic fillers such as glass fiber, silicon oxide, titanium oxide, and alumina, may be mixed with the resin, as necessary. As a result, the mechanical strength can be improved, the thermal expansion coefficient can be reduced, and the light reflectance can be improved. The wiring is formed in a predetermined pattern on the insulating material, and a material for the wiring can be at least one selected from the group consisting of gold, silver, copper and aluminum. As a method of forming the wiring, a method of disposing a metal plating or a metal foil can be appropriately selected.

Light-Emitting Element

A light-emitting diode is preferably used as the light-emitting element 2. The light-emitting device according to the first and second embodiments and the light-emitting element 2 suitable for measuring the characteristics of the diffusion member according to the third embodiment are described in detail below.

(i) First Embodiment

In the first embodiment, the light-emitting element 2 having a main wavelength in a range from 500 nm to 560 nm (green light emission) is suitable. By using the light-emitting element 2 having the emission wavelength, a light-emitting device that emits green light is attained.

When the sensitivity (luminosity factor) of the human eye to light is great, the Human perceives luminance to be great, and when it is intended to evaluate and control illumination unevenness on the basis of luminance unevenness, accurate luminance measurement may be difficult for light emission in a wavelength range with great luminosity factor. On the other hand, because the measurement sensitivity of the chromaticity x does not depend on wavelength (chromaticity), accurate chromaticity measurement can be performed even for light emission with great luminosity factor. Because green light emission having a main wavelength in a range from 500 nm to 560 nm has great luminosity factor, a green light-emitting device is particularly suitable as a subject for evaluating and controlling the illumination unevenness as an index of the chromaticity difference $\Delta x$.

A specific example of the light-emitting element 2 may include a green light-emitting element using a nitride semiconductor. Various emission wavelengths can be selected depending on a material for a semiconductor layer and the degree of mixed crystals of the semiconductor layer. Particularly, as described above, the light-emitting element 2 having a main wavelength in a range from 500 nm to 560 nm is suitable.

(ii) Second Embodiment

In the second embodiment, the light-emitting element 2 having a main wavelength in a range from 420 nm to 560 nm (blue light emission to green light emission) is suitable. By using the light-emitting element 2 having the emission wavelength, a light-emitting device that emits blue light to green light is attained.

As in the first embodiment, because the measurement sensitivity of the chromaticity y does not depend on wavelength (chromaticity), accurate chromaticity measurement can be performed regardless of the luminosity factor.

The blue to green light-emitting device is suitable as a subject for evaluating and controlling illumination unevenness as an index of the chromaticity difference $\Delta y$. Particularly, it is more preferable that the light-emitting element 2 having a main wavelength in a range from 420 nm to 480 nm (blue light emission) is evaluated by $\Delta y$. Thus, the light-emitting element 2 that emits blue light is suitable for the second embodiment in which the chromaticity difference $\Delta y$ is used for evaluation.

A specific example of the light-emitting element 2 may include a blue to green light-emitting element using a nitride semiconductor. Various emission wavelengths can be selected depending on a material for a semiconductor layer and the degree of mixed crystals of the semiconductor layer. Particularly, as described above, the light-emitting element 2 having a main wavelength in a range from 420 nm to 560 nm (particularly, from 420 nm to 480 nm) is suitable.

(iii) Third Embodiment

In the third embodiment, the light-emitting element 2 with a specific wavelength (main wavelength of 523 nm (green light emission)) is used to measure the characteristics of the diffusion member 30. By using the light-emitting element 2 having a main wavelength of 523 nm (green light emission), it makes it possible to provide the diffusion member 30 suitable for both the light-emitting device 100 specified using the chromaticity difference $\Delta x$ as in the first embodiment and the light-emitting device 100 specified using the chromaticity difference $\Delta y$ as in the second embodiment.

Diffusion Member

The diffusion member 30 is a member that scatters light from the light-emitting element 2. An example of the diffusion member 30 includes a member in which a diffusion layer is provided on a surface of a light-transmitting body. Because members such as those having unevenness on the surface of the light-transmitting body and those having a light diffusion film attached to the surface of the light-transmitting body also exhibit the same function as the diffusion member, it is assumed that the members are also included in the diffusion member in this specification. These diffusion members 30 are adjusted to be able to impart desired optical characteristics (directional chromaticity) as described above to the light-emitting device 100. For example, the amount of diffusion material added to the diffusion layer, the degree of unevenness on the surface of the light-transmitting body, and the selection of the light diffusion film are appropriately controlled.

As the diffusion member 30, it is particularly preferable to include the light-transmitting body 4 and a diffusion layer 3 disposed between the light-transmitting body 4 and the light-emitting surface 23 of the light-emitting element 2. Preferred modes of the diffusion layer 3 and the light-transmitting body 4 are described in detail below.

Diffusion Layer

The diffusion layer 3 includes, for example, resin 31 and a particulate diffusion material 9 disposed in the resin 31. The resin 31 serves as a binder of the diffusion material 9.

By appropriately controlling the concentration and particle size of the diffusion material 9 added to the diffusion member 30, the optical characteristics (directional chromaticity) of the light-emitting device 100 using the diffusion member 30 can be controlled within a desired range.

The concentration of the diffusion material 9 in the diffusion layer 3 is preferably in a range from 0.1 mass % to 20 mass % when the resin 31 is 100 mass %, and a decrease in luminous flux can be suppressed while exhibiting a desired light diffusion effect. The concentration of the diffusion material 9 is more preferably in a range from 3.0 mass % to 15.0 mass % when the resin 31 is 100 mass %, and is most preferably in a range from 5.0 mass % to 10.0 mass %.

In the first embodiment, when the diffusion member includes the diffusion material 9, the particle size of the diffusion material 9 is set in a range from 0.1 μm to 2.0 μm.

The "concentration of the diffusion material" and the "particle size of the diffusion material" are calculated by the following method.

The concentration and particle size of the diffusion material 9 included in the diffusion member 30 are obtained using an SEM-EDX image of the cross-section of the diffusion member 30. In the SEM-EDX measurement, in a cross-section cut in the thickness direction of the diffusion member 30, a range (observation range) of 10 μm×10 μm is observed at a position about half the thickness of the diffusion member 30 from a side facing the light-emitting element. Then, the diffusion material 9 included in the diffusion member 30 is specified within the observation range. With the dimensions of the observation range, several tens to about hundred particles of the diffusion materials can be measured, and the concentration and particle size of the diffusion materials can be acquired in one-time measurement.

The particle size of the diffusion material is obtained from the SEM-EDX image by the following procedure. Then, the concentration of the diffusion material is calculated (estimated) from the particle size of the diffusion material. The concentration of the diffusion material can be easily specified during manufacturing, but because it is difficult to accurately measure the concentration of the diffusion material in the state of the light-emitting device, a concentration estimated in a method to be described below is treated as the "concentration of the diffusion material".

Particle Size of Diffusion Material

A maximum diameter (maximum dimension) of each particle is measured for all diffusion materials 9 included in the observation range of the SEM-EDX image (excluding particles on the boundary line in the observation range). A center value (median value) is obtained from the frequency distribution (volume basis) of the maximum diameter of each particle, and is set as the particle size of the diffusion material 9.

Concentration of Diffusion Material

Assuming that the thickness of the diffusion member used when obtaining the concentration of the diffusion material is very thin in the depth direction of an observation region, there is no overlap of particles in the depth direction of the observation region, and it does not have a large effect when estimating the concentration of the diffusion material, it is regarded in the observation region that (total area of the diffusion member)≈(total volume of the diffusion member) and (cross-sectional area of the diffusion material)≈(volume of the diffusion material).

The total area (10 μm×10 μm=100 μm$^2$) of the diffusion member in the observation region is defined as a total volume V1 of the diffusion member.

Subsequently, the cross-sectional area (xx (maximum diameter (μm)/2)$^2$) of each diffusion material particle is obtained from the "maximum diameter of the diffusion material" obtained by the above method. Then, the total cross-sectional area of the diffusion material included in the observation range is obtained by multiplying the number of diffusion material particles counted when calculating the particle size and the obtained "cross-sectional area of each diffusion material particle." The obtained total cross-sectional area of the diffusion material is defined as a total volume V2 of the diffusion material.

Then, a volume V3 of the resin is obtained by subtracting the total volume V2 of the diffusion material from the total volume V1 of the diffusion member (V3=V1-V2).

By multiplying the total volume V2 of the diffusion material by the specific gravity of the diffusion material, the mass of the diffusion material included in the observation range is estimated. Furthermore, by multiplying the volume V3 of the resin by the specific gravity of the resin, the mass of the resin included in the observation range is estimated. Using the calculation (estimation) results, the concentration (mass %) of the diffusion material with respect to 100 mass % of resin is obtained.

The diffusion material 9 has a large refractive index difference with the resin 31, and refers to a structure where light is reflected at an interface between the diffusion material 9 and the resin 31. The diffusion material 9 used in the first embodiment is composed of a material having a refractive index difference of 0.2 or more with resin. This provides light diffusion performance. When light transmissive resin (for example, silicone resin or epoxy resin) commonly used in this technical field is used as the resin 31, aluminum oxide, titanium oxide, yttrium phosphate, calcium carbonate, barium sulfate, silicone fine particles, acrylic fine particles, boron nitride, aluminum nitride, calcium phosphate, and the like can be used singly or in combination of two or more as the diffusion material 9. Particularly, the diffusion material 9 is preferably one or more selected from the group consisting of aluminum oxide, titanium oxide, and yttrium phosphate.

Basically, the diffusion layer 3 includes no phosphor, but may include a less amount of phosphor as long as desired optical characteristics of the light-emitting device 100 are not impaired.

The thickness of the diffusion layer 3 is preferably in a range from 20 μm to 100 μm, more preferably in a range from 20 μm to 50 μm.

The diffusion layer 3 may contain a filler. The filler used in the first embodiment is preferably in a range from 0.5 μm to 40 μm. The measurement of a particle size of the filler is performed as in the measurement of the particle size of the diffusion material. When the filler is added to the diffusion layer 3, aggregation of the diffusion material 9 in the diffusion layer 3 can be reduced. Furthermore, by filling the resin 31 with a large amount of filler having a large particle size, expansion and contraction of the diffusion layer 3 due to temperature changes can be suppressed, which can contribute to improving the reliability of the light-emitting device 100. Furthermore, when a filler having a greater thermal conductivity than the resin 31 is disposed on the light-emitting element side, heat trapped in the resin 31 can be transmitted to the light-emitting element 2 side to improve the heat dissipation of the diffusion layer 3, which can contribute to improving the reliability of the light-emitting device 100.

The filler is suitable for particles of silicon oxide. Particularly, when the particles are spherical, the inside of the diffusion layer 3 can be filled with the particles, so that it is preferable because the effect caused by filler addition becomes significant. As the particles of the silicon oxide, KYKLOS MSR-11 (spherical silica manufactured by Tatsumori Ltd.) is suitable.

Transparent Member

The transparent member is used in the second and third embodiments to acquire comparative data in place of the diffusion member 30.

The transparent member is a member that does not substantially include the diffusion material 9 (member in which the concentration of the diffusion material is substantially 0 mass %). The transparent member can be composed of a transparent material such as resin or glass.

The transparent member may also include a filler as in the diffusion member 30.

A transparent member composed of resin can be manufactured from a resin paste including no diffusion material. For example, as in the manufacturing method of the diffusion member 30 to be described below, the diffusion member 30 may be manufactured by disposing a resin paste not including the diffusion material 9 on one main surface of the light-transmitting body 4 and curing the resin paste (see FIGS. 4 and 5(*a*)). Because the resin paste does not include the diffusion material 9, the light-transmitting body 4 may or may not be reversed so that two main surfaces of the light-transmitting body 4 are turned upside down.

The transparent member composed of glass can be manufactured from, for example, transparent sheet glass. The transparent member composed of the transparent glass sheet is adhered to one main surface of the light-transmitting body 4 by using a transparent adhesive. As the adhesive, the same adhesive as the adhesive layer 5 may be used.

As described above, a separate transparent member may be formed on the light-transmitting body 4, but the light-transmitting body 4 and the transparent member may be formed as one member. Specifically, when the light-transmitting body 4 and the transparent member are composed of the same material (for example, the same resin material or the same glass material), one transparent resin plate or one transparent glass sheet may be processed into a desired dimension to be used as a member serving as both the light-transmitting body 4 and the transparent member.

Light-Transmitting Body

The light-transmitting body 4 is a member that supports the diffusion layer 3 formed on the surface of the light-transmitting body 4. A plate-shape body composed of a light-transmitting material such as glass or resin can be used as the light-transmitting body 4.

The glass can be selected from the group consisting of, for example, borosilicate glass, quartz glass, low alkali glass, and aluminosilicate glass. Furthermore, the resin can be selected from the group consisting of, for example, silicone resin, epoxy resin, acrylic resin, and polyimide resin. The thickness of the light-transmitting body 4 may be any thickness, as long as it does not reduce a mechanical strength in the manufacturing process and has a mechanical strength enough to support the diffusion layer 3. Furthermore, when the thickness of the light-transmitting body 4 is too thick, it may interfere with size reduction of the light-emitting device, thus it is preferable that the light-transmitting body 4 has an appropriate thickness. The main surface of the light-transmitting body 4 (main surface in which the diffusion layer 3 is formed) is preferably larger than the upper surface (light-emitting surface 23) of the light-emitting element 2. The diffusion layer 3 is disposed on the entire main surface of the light-transmitting body 4, and this is for reliably disposing the diffusion layer 3 on the entire upper surface (light-emitting surface 23) of the light-emitting element 2 even though there is a slight deviation in mounting accuracy when the light-transmitting body 4 with the diffusion layer 3 disposed thereon is disposed on the upper surface (light-emitting surface 23) of the light-emitting element 2.

Adhesive Layer

The diffusion member 30 is preferably bonded to the light-emitting element 2 via the adhesive layer 5 interposed between the light-emitting element 2 and the diffusion layer 3. When the adhesive layer 5 is used, an adhesive constituting the adhesive layer 5 is preferably a material that can guide light emitted from the light-emitting element 2 into the diffusion layer 3 and that can optically connect the light-emitting element 2 and the diffusion layer 3. Specific examples of the adhesive layer 5 may include organic resin such as silicone resin, epoxy resin, phenol resin, and polyimide resin, but the silicone resin is preferable. The thickness of the adhesive layer 5 is preferably as thin as possible. This is because heat dissipation is improved by reducing the thickness of the adhesive layer 5 and light output from the light-emitting device is improved by reducing the loss of light transmitted through the adhesive layer 5.

The adhesive layer 5 is preferably disposed not only between the light-emitting element 2 and the diffusion layer 3 but also on the lateral surface of the light-emitting element 2. The outer surface of the adhesive layer 5 disposed on the lateral surface of the light-emitting element 2 can reflect light emitted from the lateral surface of the light-emitting element 2 and make it enter the diffusion layer 3, thereby improving the light extraction efficiency of the light-emitting device 100. Particularly, as illustrated in FIG. 1, it is preferable that on the lateral surface of the light-emitting element 2, when viewed in vertical cross section, an adhesive extends to corner portions of the diffusion layer 3 protruding from the lateral surface of the light-emitting element 2 and the upper surface of the light-emitting element, and the adhesive layer 5 has a cross-sectional triangular shape in which the thickness of the extending adhesive layer 5 decreases toward the lower direction of the light-emitting element 2, the corner portions being formed from a surface on the light-emitting element side. Moreover, it is preferable that a part of the covering member 6 is in contact with the adhesive layer 5 having a cross-sectional triangular shape and is tapered. As a result, light emitted from the lateral surface of the light-emitting element 2 is reflected at an interface between the adhesive layer having a cross-sectional triangular shape and the tapered covering member 6. Moreover, because an area of the diffusion layer 3 is larger than an area of the upper surface of the light-emitting element 2, the light is likely to enter an outer peripheral portion of the diffusion layer 3 protruding outward from the upper surface of the light-emitting element 2, so that the light emission luminance of the light-emitting device 100 can be further improved. Such protrusion of the adhesive layer 5 can also be formed by adjusting the amount of adhesive that adheres the diffusion member 30 to the upper surface of the light-emitting element 2 and allowing an excess amount, other than the amount of adhesive required for adhering to the upper surface of the light-emitting element 2, to protrude to the lateral surface of the light-emitting element 2.

Furthermore, it is preferable that the resin 31 of the diffusion layer 3 and the main material for the adhesive of the adhesive layer 5 are of the same type (preferably, same material). For example, when silicone resin is used for the resin 31 of the diffusion layer 3, it is preferable to use the silicone resin for the adhesive of the adhesive layer 5 as well. This can reduce the refractive index difference between the diffusion layer 3 and the adhesive layer 5, and thus light incident from the adhesive layer 5 to the diffusion layer 3 can be increased.

Semiconductor Element

The semiconductor element 8 may be disposed on the substrate 1 adjacently to the light-emitting element 2, separately from the light-emitting element 2. Examples of such a semiconductor element 8 may include a transistor for controlling the light-emitting element and a protective element to be described below, in addition to another light-emitting element not intended to emit light from the light-emitting device 100. The protective element is an element for protecting the light-emitting element 2 from element destruction or performance degradation due to excessive voltage application. Specifically, the protective element includes a Zener diode that becomes conductive when a voltage equal to or greater than a prescribed voltage is applied. The protective element is the semiconductor element 8 having a p-electrode and an n-electrode, as in the light-emitting element 2, and is arranged in anti-parallel with respect to the p-electrode and the n-electrode of the light-emitting element 2, that is, the n-electrode and the p-electrode of the light-emitting element 2 are electrically connected to the p-electrode and the n-electrode of the protective element via the conductive member 7, respectively. Also in the case of the protective element, as in the case of the light-emitting element 2, each electrode of the protective element faces each conductive member 7, and heat, ultrasonic, and load are applied, so that the electrode of the protective element can be bonded to the wiring of the substrate 1 via the conductive member 7.

Preferably, the height of the semiconductor element 8 when disposed on the substrate 1 is lower than the total height of the light-emitting element 2, the diffusion layer 3, and the light-transmitting body 4. This is because the semiconductor element 8 can be easily covered by the covering member 6.

Covering Member

In order to increase the front luminance of the light-emitting device 100, the covering member 6 covers as necessary at least a part of the lateral surface of the light-emitting element 2 and at least a part of the lateral surface of the diffusion member 30. When the covering member 6 is used, it is preferable to use an insulating material as a material for the covering member 6. Furthermore, in order to ensure a certain degree of strength, for example, thermosetting resin, thermoplastic resin, or the like can be used. More specifically, examples of the resin include silicone resin, epoxy resin, BT resin, PPA, phenol resin, or the like. Furthermore, light can be efficiently reflected by dispersing, into base resin of the above resin, powder of a material (for example, the same material as the diffusion material added to the diffusion layer 3 as described above) that does not easily absorb light from the light-emitting element 2 and has a large refractive index difference with the base resin.

The supplying the material forming the covering member 6 can be performed, for example, by using a resin discharge device that can be discretionarily moved (movable) with respect to the substrate 1 above the fixed substrate 1. That is, for example, the resin discharge device filled with resin is moved while discharging liquid resin from a nozzle at a leading end of the resin discharge device, so that a material for the covering member 6 is injected in the vicinity of the light-emitting element 2 and the semiconductor element 8. The movement speed of the resin discharge device can be appropriately adjusted according to the viscosity, temperature, and the like of resin to be used. The discharge amount can be adjusted by, for example, fixing the pressure or the like applied during discharge. The viscosity of the material for the covering member 6 is 0.35 Pas to 13.0 Pa's, preferably 3.0 Pa's to 5.5 Pa's at room temperature (20±5° C.).

Conductive Member

When the conductive member 7 is used, a bump can be used as the conductive member 7, Au or an Au alloy can be used as a material for the bump, and eutectic solder (Au—Sn), Pb—Sn, lead-free solder, or the like can be used as the other conductive members 7. FIG. 2 illustrates an example in which a bump is used as the conductive member 7, but the conductive member 7 is not limited to the bump and may be, for example, a conductive paste.

Underfill

An underfill is a member for protecting the light-emitting element 2 disposed on the substrate 1 and the semiconductor element 8, which is different from the light-emitting element 2, the conductive member 7, and the like from dust, moisture, external impact, and the like. The underfill can be disposed in a gap between the substrate 1 and the light-emitting element 2 and a gap between the substrate 1 and the semiconductor element 8, and also a gap between the conductive member 7 and another conductive member 7.

Examples of a material for the underfill include silicone resin, epoxy resin, urea resin, and the like. In addition to such materials, a colorant, a diffusion material, a filler, a phosphor, or the like can be contained as necessary.

Fourth Embodiment: Manufacturing Method of Light-Emitting Device and Diffusion Member An example of a manufacturing method of the light-emitting device 100 according to the first and second embodiments and the diffusion member according to the third embodiment is illustrated.

Manufacturing Method of Diffusion Member 30

FIG. 4 and FIGS. 5(a) to 5(c) are schematic cross-sectional views illustrating the manufacturing method of the diffusion member 30, A resin paste 3A including the diffusion material 9 and a resin material is disposed on one main surface of the light-transmitting body 4.

The diffusion layer 3 is formed on the surface of the light-transmitting body 4 by, for example, a printing method. The method of forming the diffusion layer 3 is not limited to the printing method, but the method of forming the diffusion layer is described below with the printing method.

The resin paste 3A including the diffusion material 9, a resin material, and a solvent is prepared, and then applied to the surface (main surface) of the light-transmitting body 4. Organic resin such as silicone resin, epoxy resin, phenol resin, and polyimide resin can be used as the resin material. The resin paste 3A may include a filler as necessary. The resin paste 3A may be applied, for example, by supplying the resin paste 3A onto a screen plate disposed on the light-transmitting body 4, moving a squeegee so that the resin paste 3A passes through the screen plate, and then applying the resin paste 3A of a predetermined thickness to the light-transmitting body 4. As a result, the resin paste 3A can be applied at a uniform thickness.

Subsequently, the resin material for the resin paste 3A is cured to attain the diffusion layer 3. The resin material is cured by an appropriate method such as drying, heating, or ultraviolet irradiation, according to the type of resin material.

Figure 4:
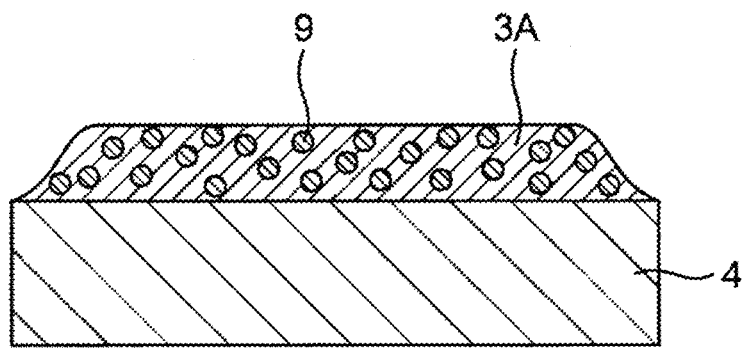
FIG. 4 is a schematic cross-sectional view illustrating a manufacturing method of a diffusion member.
Figure 5:
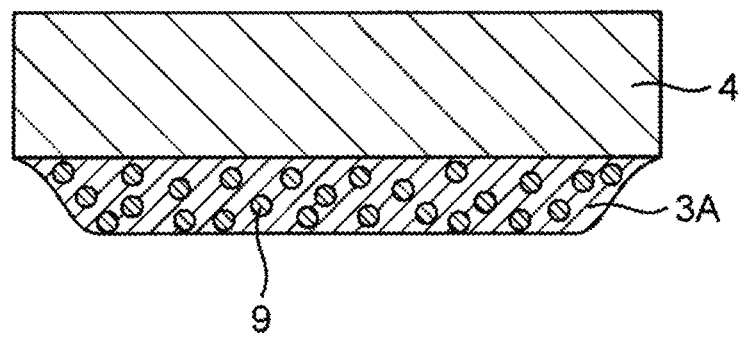
FIG. 5 includes diagrams (a) to (c) that are schematic cross-sectional views illustrating the manufacturing method of the diffusion member.
Figure 5:
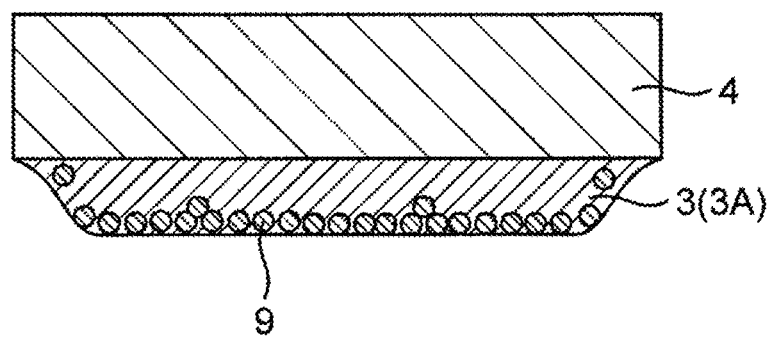
Figure 5:
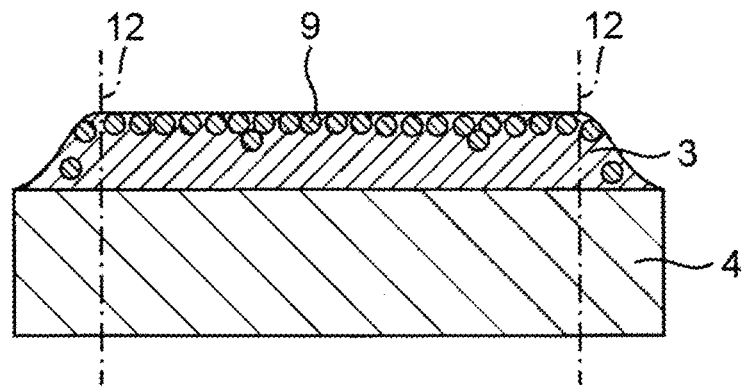

Before the resin paste 3A is cured, as illustrated in FIG. 4, the resin paste 3A may be applied on one main surface of the light-transmitting body 4, and then, as illustrated in FIG. 5(a), the main surface of the light-transmitting body 4 on which the resin paste 3A is applied may face downward. That is, the light-transmitting body 4 may be reversed so that the two main surfaces of the light-transmitting body 4 are turned upside down. As illustrated in FIG. 5(B), the diffusion material 9 is allowed to settle on a side opposite to the surface of the resin paste 3A that is in contact with the light-transmitting body 4. An example of the settling method can include a natural sedimentation method using the gravity applied to the diffusion material 9. As a result, the concentration of the diffusion material 9 in the diffusion layer 3 formed on the main surface of the light-transmitting body 4 facing the light-emitting element 2 can be made greater on a side closer to the light-emitting element 2 than on a side closer to the light-transmitting body in the direction perpendicular to the main surface. Then, in a state in which a desired distribution of the diffusion material 9 is formed in the resin paste 3A (preferably, a state in which the diffusion material 9 has fully been settled down), the resin material for the resin paste 3A is cured to attain the diffusion layer 3. This can be substantially the same (substantially uniform) in the direction parallel to the main surface of the light-transmitting body.

The diffusion member 30 of this mode can be attained by the method described above. However, in the diffusion layer 3 formed on the light-transmitting body 4 by such a method, when viewed in plan view in a direction perpendicular to the main surface of the light-transmitting body 4 on which the diffusion layer 3 is formed, the concentration distribution of the diffusion material 9 may not be in a desired state in the vicinity of the outer periphery of the diffusion layer 3 (hereinafter, referred to as "peripheral edge"). Particularly, when the printing method is used for the method for forming the diffusion layer 3, because the thickness of the diffusion layer 3 may be thinner toward the peripheral edge as illustrated in FIG. 4, the distribution state of the diffusion material 9 may be different between a portion away from the peripheral edge and the peripheral edge, and particles of the diffusion material may be disposed at positions deviated from desired positions. To solve such a problem, it is preferable that the method further include a step of cutting out the diffusion layer 3 and the light-transmitting body 4 that includes selecting a region having substantially the same distribution of the diffusion material 9 from an inner region excluding the peripheral edge of the diffusion layer 3 (inner region excluding the peripheral edge of the diffusion layer 3 and the peripheral edge of the light-transmitting body 4) along the cutting lines 12 in FIG. 5(*c*), and cutting out the diffusion layer 3 and the light-transmitting body 4 into a predetermined shape. This cutting step enables to attain a diffusion member in which the concentration of the diffusion material 9 in the diffusion layer 3 has substantially the same distribution in the direction parallel to the main surface of the light-transmitting body. More preferably, by adjusting the amount of the diffusion material 9 and the above-described settling time and further selecting a portion to be cut out as the diffusion member, the particles of the diffusion material 9 can be thoroughly arranged over a space from a lateral surface of the diffusion layer exposed by the cutting step to a lateral surface facing this lateral surface, as illustrated in FIG. 1.

Figure 6:
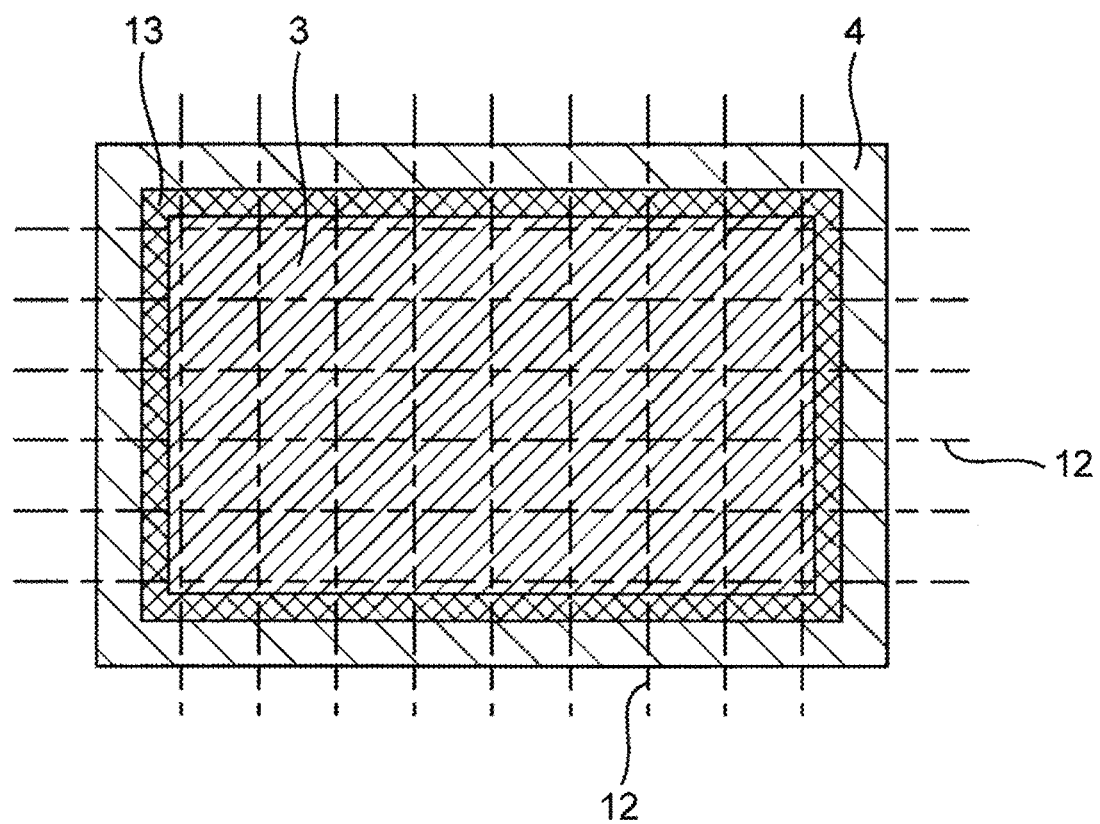
FIG. 6 is a schematic plan view illustrating a modified example of the manufacturing method of the diffusion member.

Modified Example of Manufacturing Method of Diffusion Member 30 FIG. 6 is a schematic plan view illustrating a modified example of the manufacturing method of the diffusion member 30. In the method illustrated in FIG. 6, many diffusion members 30 can be manufactured more efficiently. The conditions described above may be used for manufacturing conditions not specifically described.

The resin paste 3A is applied to one main surface of the light-transmitting body 4. Subsequently, the main surface of the light-transmitting body 4 to which the resin paste 3A is applied may face downward, and the diffusion material 9 may be allowed to settle on the side opposite to the surface of the resin paste 3A that is in contact with the light-transmitting body 4. Subsequently, the resin material for the resin paste 3A is cured to attain the diffusion layer 3.

Subsequently, by performing a singulation step of cutting the diffusion layer 3 and the light-transmitting body 4 along cutting lines 12 illustrated in FIG. 6, a plurality of diffusion members 30 each having a predetermined shape can be attained.

In the singulation step, preferably, the individual diffusion members 30 (the diffusion layer 3 and the light-transmitting body 4) are cut out from an inner region excluding a peripheral edge 13 of the diffusion layer 3 so that the peripheral edge 13 of the diffusion layer 3 is not included in the diffusion member 30 after the singulation, and are singulated into a predetermined shape. Furthermore, among the plurality of cut diffusion members 30, diffusion members 30 having substantially the same distribution of diffusion materials in the diffusion layer are selected and a plurality of light-emitting devices 100 are manufactured using the selected diffusion members 30, so that the optical characteristics of each of these light-emitting devices 100 can be made uniform.

Manufacturing Method of Light-Emitting Device 100

A method of manufacturing the light-emitting device 100 by using the diffusion member 30 attained in this way is described below. The method of manufacturing the light-emitting device 100 includes a step of preparing the light-emitting element 2 and a step of disposing the diffusion member 30 on the light-emitting element 2.

The step of preparing the light-emitting element 2 is performed, for example, by flip-chip mounting the light-emitting element 2 and, as necessary, the semiconductor element 8 on the substrate 1 in which the wiring 11 isolated from a positive electrode and a negative electrode is formed.

In the step of disposing the diffusion member 30 on the light-emitting element 2, for example, the diffusion member 30 is bonded to the upper surface (light-emitting surface 23) of the light-emitting element 2 via the adhesive layer 5. The adhesive layer 5 adheres the diffusion layer 3 and the light-emitting element 2 together. Moreover, the diffusion layer 3 may be formed larger than the area of the upper surface (light-emitting surface 23) of the light-emitting element 2, and in such a case, the diffusion layer 3 has an exposed portion not covered by the upper surface of the light-emitting element and is bonded to the light-emitting element 2. Therefore, when the diffusion layer 3 is disposed on the upper surface of the light-emitting element 2, an adhesive protruding from the upper surface of the light-emitting element 2 adheres to the lateral surface of the light-emitting element 2 and the exposed portion of the diffusion layer, and forms a protruding portion of the adhesive layer 5 on the lateral surface of the light-emitting element 2. The adhesive layer 5 on the lateral surface of the light-emitting element 2 may have a cross-sectional triangular shape in which the thickness of the layer decreases in the direction opposite to the diffusion layer 3 with respect to the light-emitting element 2 when viewed in vertical cross section. As a result, because light emitted from the lateral surface of the light-emitting element 2 is reflected at a wide range of angles by the adhesive layer 5 on the lateral surface, the light is more likely to enter the outer peripheral portion of the diffusion layer 3, so that the luminance of the light-emitting device 100 can be further improved. Furthermore, in the manufacturing process, the adhesive before adhesion can also be applied to the diffusion layer 3, and can also be applied to the upper surface of the light-emitting element 2. At this time, a part of the adhesive is preferably extended to a corner portion including the lateral surface of the light-emitting element 2 and a surface of the diffusion layer 3 on the light-emitting element 2 side. This is for forming a part of the adhesive layer 5 protruding on the lateral surface of the light-emitting element 2 into a cross-sectional triangular shape.

The covering member 6 may be disposed as necessary. The covering member 6 is disposed along the lateral surface of the light-emitting element 2 and the lateral surface of the diffusion member 30. The covering member 6 is for reflecting light emitted from the light-emitting element 2. The covering member 6 may cover the entire semiconductor element 8.

The gap among the substrate 1, the light-emitting element 2, and the semiconductor element 8 and the gap between the conductive member 7 and another conductive member 7 may be filled with an underfill.

EXAMPLES (1) Examples 1 to 8: Green Light-Emitting Device

As Examples 1 to 8, measurement samples of the light-emitting device 100 illustrated in FIGS. 1 and 2 were produced as follows.

The light-emitting element 2 and the semiconductor element 8 were placed on the substrate 1. Specifically, the light-emitting element 2 formed by stacking a semiconductor layer on a sapphire substrate was flip-chip mounted using the conductive member 7 composed of Au by disposing the light-emitting element 2 and the semiconductor element 8 in a row so that the sapphire substrate side serves as a light-emitting surface, the light-emitting element 2 having a thickness of about 0.15 mm, a planar shape of about 1.0 mm substantially square, and a main wavelength of 523 nm. The semiconductor element 8 provided in advance with a bump composed of Au was flip-chip mounted on the wiring 11 of the substrate 1.

Subsequently, the diffusion layer 3 was applied to the surface of the light-transmitting body 4, that is, the entire one main surface by printing. As a material for the light-transmitting body 4, a plate-shaped borosilicate glass was used. The planar shape of the light-transmitting body 4 is about 1.15 mm substantially square and is larger than the planar shape of the light-emitting element 2 by about 0.15 mm in length and width, and the thickness of the light-transmitting body 4 is about 0.145 mm. In the light-transmitting body on which the diffusion layer 3 was formed, alumina oxide with a center particle size of 0.4 μm was used as the diffusion material, and silicone resin was used as the resin 31 to be printed on one main surface of the light-transmitting body 4 having a plate shape and cut into an appropriate size.

The concentration of the diffusion material in the diffusion layer 3 is shown in Table 1 below. The planar shape of the diffusion layer facing the light-emitting surface 23 of the light-emitting element 2 was about 1.15 mm substantially square, as in the planar shape of the light-transmitting body 4, and the thickness of the diffusion layer was about 35 μm. The thickness of the light-transmitting body 4 was about 145 μm, and the total thickness of the light-transmitting body 4 and the diffusion layer 3 was about 180 μm.

Subsequently, the silicone resin is disposed on the light-emitting surface 23 of the light-emitting element 2 as an adhesive, and the diffusion layer 3 formed on the light-transmitting body 4 and the sapphire substrate of the light-emitting element 2 are adhered. The area of the diffusion layer 3 on the light-emitting element side is formed larger than the area of the upper surface of the light-emitting element 2, and the diffusion layer 3 is bonded to have an exposed surface exposed from the bonding surface.

Subsequently, the covering member 6 is supplied in the circumferences of the light-emitting element 2, the diffusion layer 3, the light-transmitting body 4, and the semiconductor element 8. The covering member 6 was disposed along the lateral surfaces of the light-emitting element 2, the diffusion layer 3, and the light-transmitting body 4, and the semiconductor element 8 was completely embedded in the covering member 6. Dimethyl silicone resin was used as the resin of the covering member 6, and a titanium oxide particle having an average particle size of 0.28 μm were used as a light-reflecting material. The titanium oxide particle of 60 mass % was contained with respect to the resin. The thickness of the covering member 6 is a thickness in the vertical direction (z direction in FIG. 1) from the lateral surface of the light-emitting element 2 to the outside of the light-emitting device 100, and the covering member 6 has the thinnest portion with the thickness of 225 μm except for an area in which the semiconductor element 8 exists. The light-emitting device 100 as illustrated in FIGS. 1 and 2 was produced by such steps.

Chromaticity and Main Wavelength

The chromaticity and main wavelength of the measurement samples for the light-emitting device were measured by an optical measurement system obtained by combining a multichannel spectrometer and an integrating sphere. Table 1 shows the evaluation results.

Directional Chromaticity

The relationship (angular dependency) with the measurement direction was investigated for the emission color of each measurement sample. When measuring the directional chromaticity (light distribution chromaticity), after a current of 1000 mA is applied to the light-emitting devices of each Comparative Example and Examples to emit light, emission colors were measured using a spectral distribution measurement device under the condition of Condition B which is "average LED light intensity" measurement recommended by the Commission Internationale de l'Eclairage (CIE), while changing the measurement direction by rotating an LED using a goniometer. The emission colors were measured in the measurement planes of both the Axz plane and the Ayz plane. To evaluate the emission colors, an x value and a y value based on the CIE color system were used. The chromaticities x and y of the emission color at θ=0° (perpendicular line) were set as reference values $x_0$ and $y_0$, respectively, and the chromaticity measurement was performed in the range from θ=−60° to 60° in each measurement plane.

Figure 7:
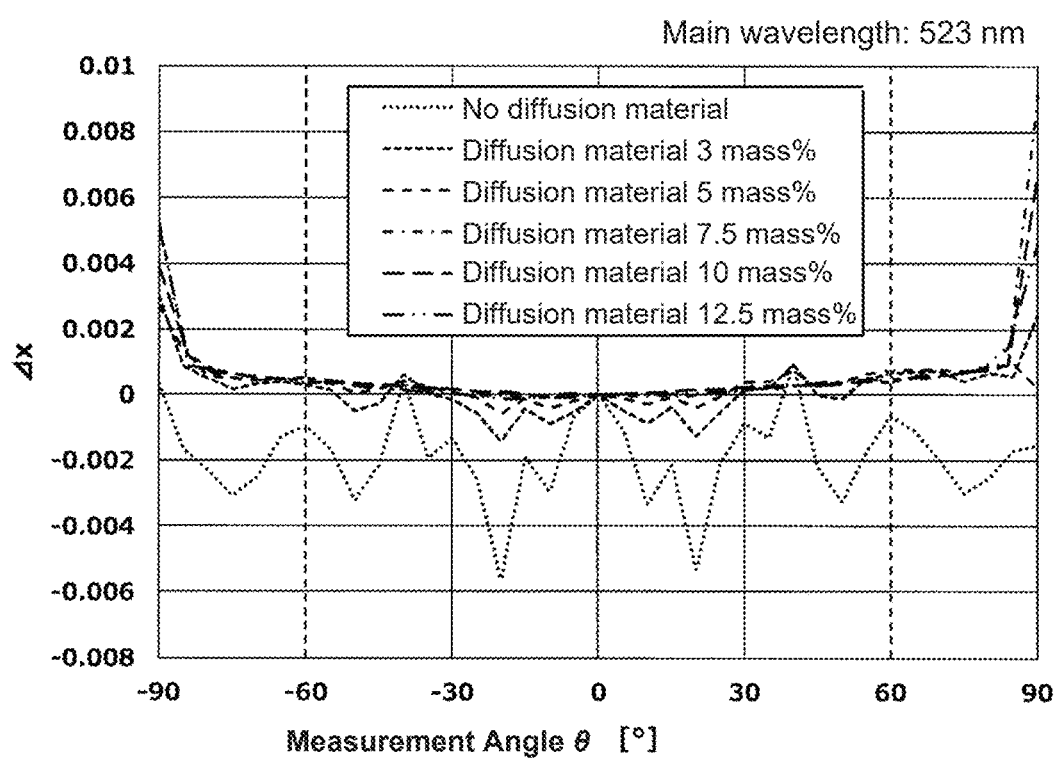
FIG. 7 is a graph showing the directional chromaticity Δx of measurement samples according to Examples 1 to 8.

For the chromaticity x, differences $\Delta x_1$ and $\Delta x_2$ between the maximum and minimum values of a deviation from the reference value $x_0$ (chromaticity difference $\Delta x$) were calculated, and the directional chromaticity of the light-emitting device was evaluated from the average value α of the differences. Table 1 shows the evaluation results. As an example of the results of the chromaticity measurement, FIG. 7 shows a graph of the directional chromaticity in the Axz plane.

Figure 8:
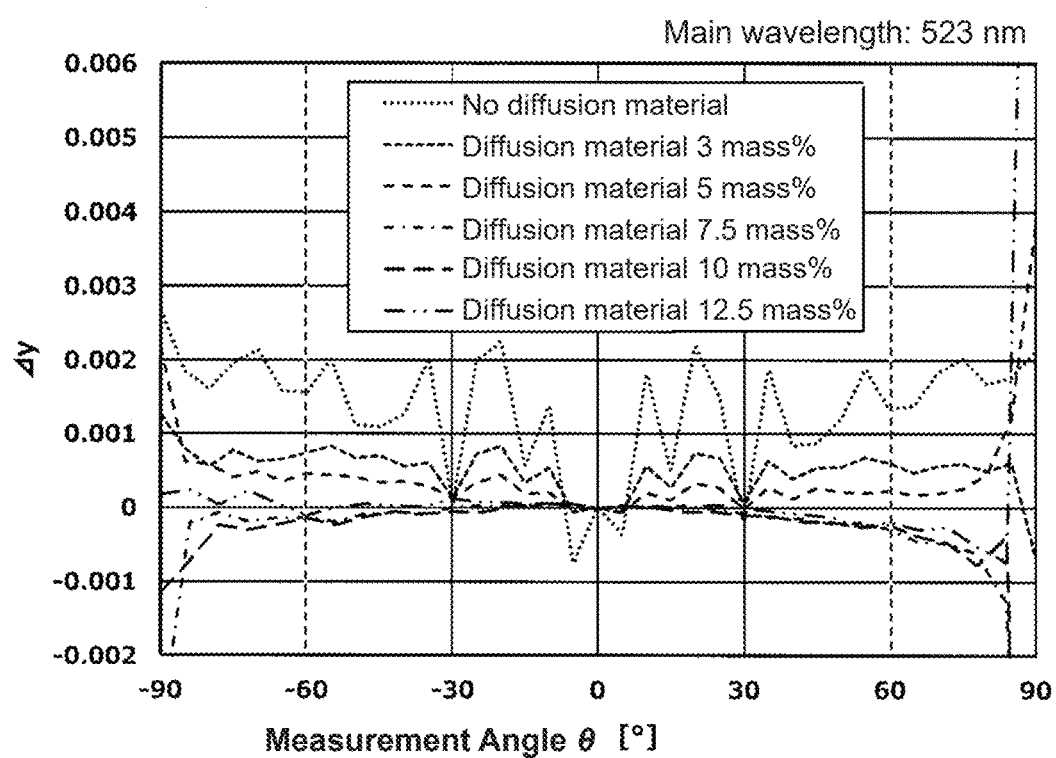
FIG. 8 is a graph showing the directional chromaticity Δy of the measurement samples according to Examples 1 to 8.

For the chromaticity y, differences $\Delta y_1$ and $\Delta y_2$ between the maximum and minimum values of a deviation from the reference value $y_0$ (chromaticity difference $\Delta y$) were calculated, and the directional chromaticity of the light-emitting device was evaluated from the average value β of the differences. Table 2 shows the evaluation results. As an example of the results of the chromaticity measurement, FIG. 8 shows a graph of the directional chromaticity in the Axz plane.

Illumination Unevenness

Figure 9:
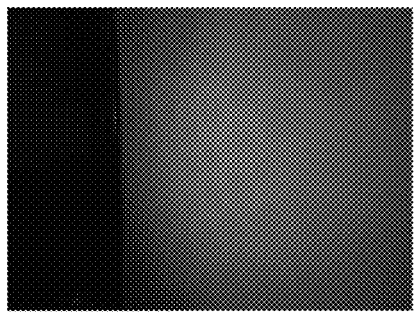
FIG. 9 is a photograph of a plane irradiated with light emitted from the measurement samples according to Examples 1 to 8.
Figure 9:
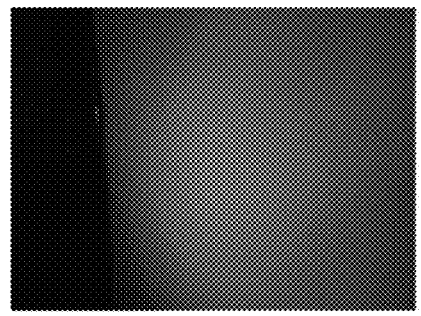
Figure 9:
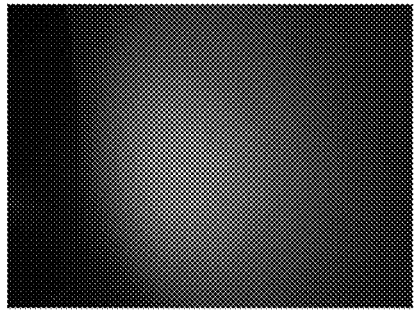
Figure 9:
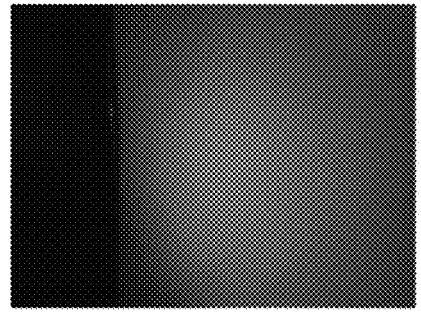
Figure 9:
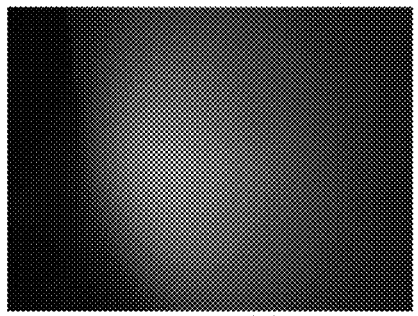
Figure 9:
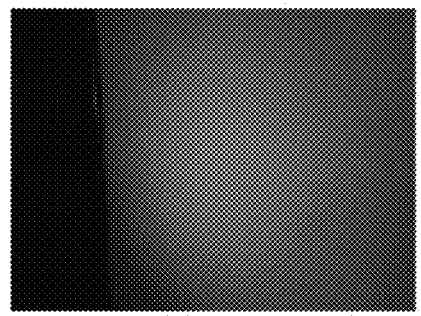
Figure 9:
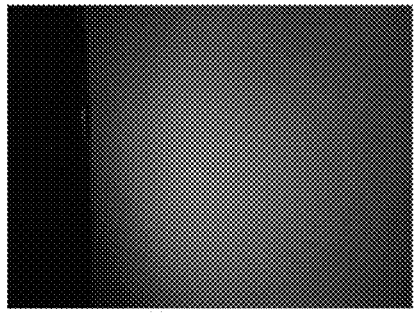
Figure 9:
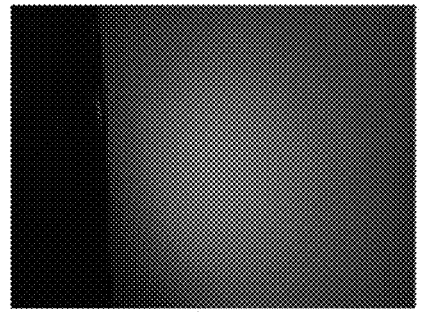

Regarding the illumination unevenness, it was visually confirmed whether the shape of the electrode of the light-emitting element is projected to a plane irradiated with light emitted from the measurement samples. FIG. 9 illustrates a photograph of a plane irradiated with light emitted from the measurement samples. A case in which illumination unevenness due to projection of the electrode shape of the light-emitting element is recognizable is indicated by "x", and a case in which illumination unevenness is not recognizable (no illumination unevenness) is indicated by "o", which are shown in Tables 1 and 2 below.

(ii) Evaluation on Sample Nos. 1 to 8 on the basis of Chromaticity y.

In the measurement samples with sample Nos. 2 and 3, the average value $\beta$ of the differences $\Delta y_1$ and $\Delta y_2$ between the maximum value and the minimum value of $\Delta y$ was 30% or more of the average value $\beta$ (=average value $\beta'$) of the differences $\Delta y_1$ and $\Delta y_2$ between the maximum value and the minimum value of $\Delta y$ of the measurement sample with sample No. 1 (measurement sample including a transparent member instead of the diffusion member).

In the measurement samples with sample Nos. 1 to 3, the average value $\beta$ was 0.0010 or more.

TABLE 1

Main wavelength 523 nm and chromaticity difference $\Delta x$ of light-emitting element 2

| Test No. | Concentration of diffusion material (Mass %) | Chromaticity (reference value) $x_0$ | $y_0$ | Wavelength (nm) | Difference between maximum value and minimum value of chromaticity difference $\Delta x$ | | | Illumination unevenness |
|---|---|---|---|---|---|---|---|---|
| | | | | | Axz plane ($\Delta x_1$) | Ayz plane ($\Delta x_2$) | Average value $\alpha$ ($\Delta x_1 + \Delta x_2)/2$ | |
| 1 | 0 | 0.150 | 0.720 | 523.0 | 0.0065 | 0.0054 | 0.00595 | x |
| 2 | 1.0 | 0.151 | 0.722 | 523.2 | 0.0031 | 0.0027 | 0.0029 | x |
| 3 | 2.0 | 0.149 | 0.718 | 522.6 | 0.0028 | 0.0023 | 0.00255 | x |
| 4 | 3.0 | 0.151 | 0.720 | 523.1 | 0.0023 | 0.0020 | 0.00215 | o |
| 5 | 5.0 | 0.151 | 0.722 | 523.4 | 0.0013 | 0.0012 | 0.00125 | o |
| 6 | 7.5 | 0.151 | 0.722 | 523.3 | 0.0006 | 0.0007 | 0.00065 | o |
| 7 | 10.0 | 0.152 | 0.727 | 523.8 | 0.0005 | 0.0005 | 0.0005 | o |
| 8 | 12.5 | 0.152 | 0.723 | 523.5 | 0.0006 | 0.0006 | 0.0006 | o |

TABLE 2

Main wavelength 523 nm and chromaticity difference $\Delta y$ of light-emitting element 2

| Test No. | Concentration of diffusion material (Mass %) | Chromaticity (reference value) $x_0$ | $y_0$ | Wavelength (nm) | Difference between maximum value and minimum value of chromaticity difference $\Delta y$ | | | Sufficiency of Formula (1) | Illumination unevenness |
|---|---|---|---|---|---|---|---|---|---|
| | | | | | Axz plane ($\Delta y_1$) | Ayz plane ($\Delta y_2$) | Average value $\beta$ ($\Delta y_1 + \Delta y_2)/2$ | | |
| 1 | 0 | 0.150 | 0.720 | 523.0 | 0.0030 | 0.0035 | 0.00325 | x | x |
| 2 | 1.0 | 0.151 | 0.722 | 523.2 | 0.0012 | 0.0012 | 0.0012 | x | x |
| 3 | 2.0 | 0.149 | 0.718 | 522.6 | 0.0010 | 0.0012 | 0.0011 | x | x |
| 4 | 3.0 | 0.151 | 0.720 | 523.1 | 0.0009 | 0.0010 | 0.00095 | o | o |
| 5 | 5.0 | 0.151 | 0.722 | 523.4 | 0.0005 | 0.0005 | 0.0005 | o | o |
| 6 | 7.5 | 0.151 | 0.722 | 523.3 | 0.0003 | 0.0003 | 0.0003 | o | o |
| 7 | 10.0 | 0.152 | 0.727 | 523.8 | 0.0003 | 0.0003 | 0.0003 | o | o |
| 8 | 12.5 | 0.152 | 0.723 | 523.5 | 0.0004 | 0.0004 | 0.0004 | o | o |

(i) Evaluation on Sample Nos. 1 to 8 on the basis of Chromaticity x

In the measurement samples with sample Nos. 1 to 3, because the diffusion member includes no diffusion material (that is, is a transparent member) or the amount of the diffusion material is not appropriate, the average value a of the differences $\Delta x_1$ and $\Delta x_2$ between the maximum value and the minimum value of $\Delta x$ is 0.0024 or more and there was illumination unevenness.

In the measurement samples with sample Nos. 4 to 8, because the amount of the diffusion material is appropriate, the average value of the differences $\Delta x_1$ and $\Delta x_2$ between the maximum value and the minimum value of $\Delta x$ is less than 0.0024 and illumination unevenness was not recognized.

Furthermore, in the measurement samples with sample Nos. 1 to 3, the average value $\beta$ did not satisfy formula (1) below. That is, the average value $\beta$ was $(0.0006y_0+0.0006)$ or more.

$$\beta < 0.0006y_0 + 0.0006 \quad (1)$$

In the measurement samples with sample Nos. 1 to 3, there was illumination unevenness.

In the measurement samples with sample Nos. 4 to 8, the average value $\beta$ was less than 30% of the average value $\beta$ (=average value $\beta'$) of the measurement sample with sample No. 1.

In the measurement samples with sample Nos. 4 to 8, the average value $\beta$ was less than 0.0010.

Furthermore, in the measurement samples with sample Nos. 4 to 8, the average value satisfied formula (1) above.

In the measurement samples with sample Nos. 4 to 8, illumination unevenness was not recognized.

(2) Examples 9-15: Blue Light-Emitting Device

The light-emitting device was manufactured under the same conditions as in sample Nos. 1 to 7, except for using the light-emitting element 2 having a main wavelength of 470 nm, and measurement samples with sample Nos. 9 to 15 were used.

In the same manner as in sample Nos. 1 to 7, the chromaticity, main wavelength, directional chromaticity, and illumination unevenness of the measurement samples with sample Nos. 9 to 15 were measured.

Figure 10:
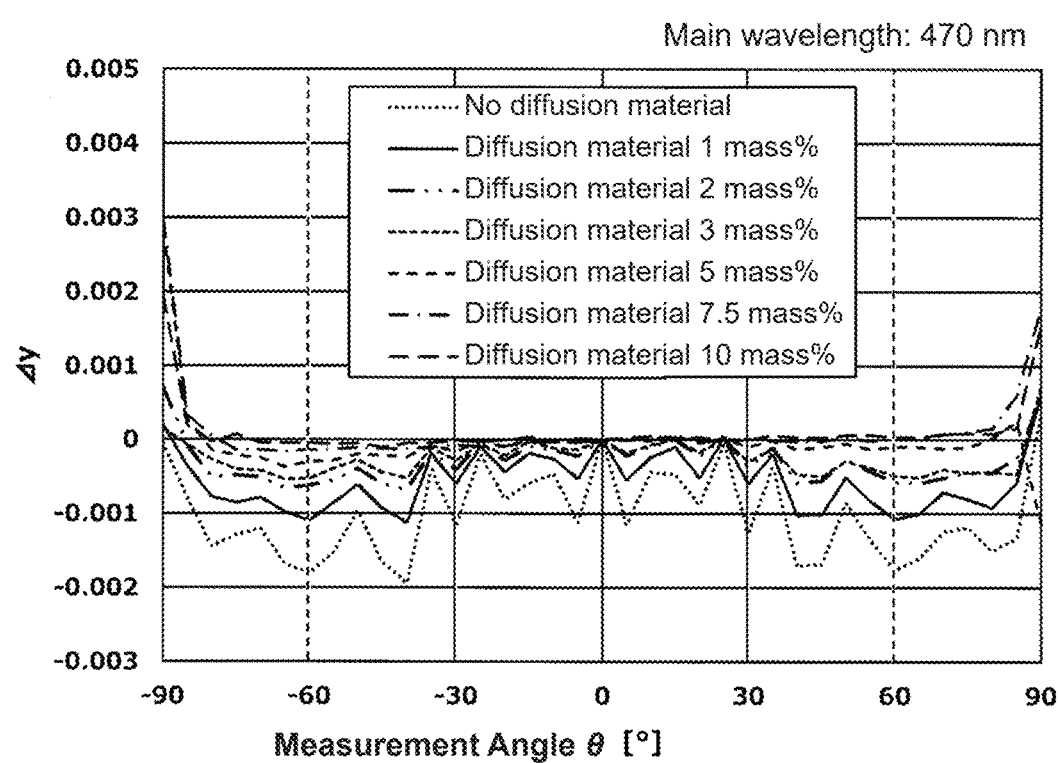
FIG. 10 is a graph showing the directional chromaticity Δy of measurement samples according to Examples 9 to 15.
Figure 11:
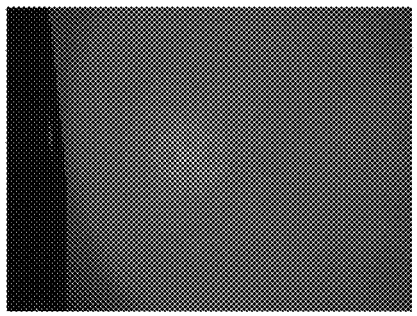
FIG. 11 is a photograph of a plane irradiated with light emitted from the measurement samples according to Examples 9 to 15.
Figure 11:
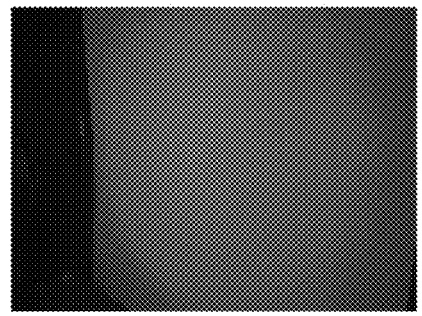
Figure 11:
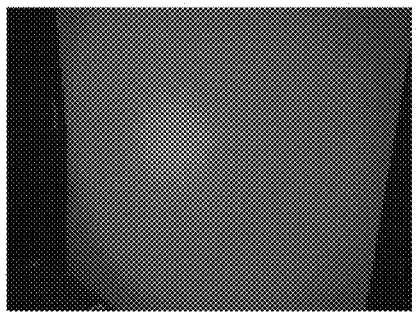
Figure 11:
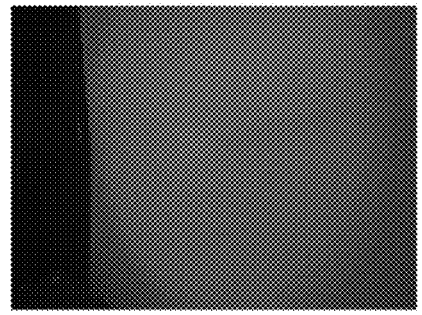
Figure 11:
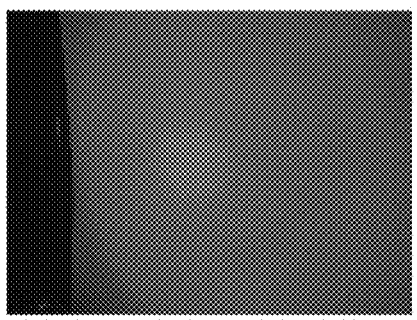
Figure 11:
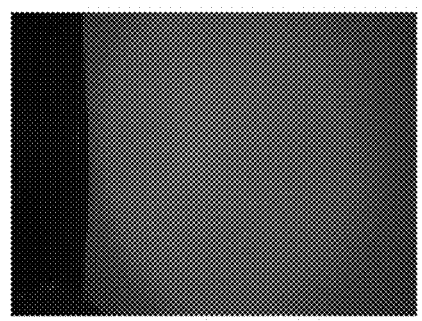
Figure 11:
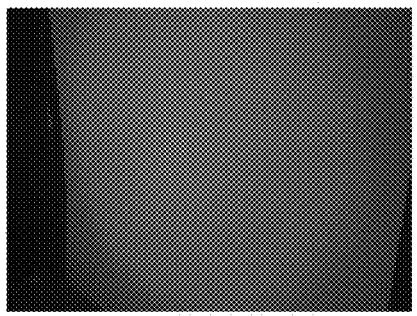

The measurement results of the measurement samples with sample Nos. 9 to 15 are shown in Table 3 below and FIGS. 10 and 11.

TABLE 3

Main wavelength 4709 nm and chromaticity difference Δy of light-emitting element 2

| Test No. | Concentration of diffusion material (Mass %) | Chromaticity (reference value) $x_0$ | $y_0$ | Wavelength (nm) | Difference between maximum value and minimum value of chromaticity difference Δy | | | Sufficiency of Formula (1) | Illumination unevenness |
| | | | | | Axz plane ($\Delta y_1$) | Ayz plane ($\Delta y_2$) | Average value β ($\Delta y_1 + \Delta y_2$)/2 | | |
|---|---|---|---|---|---|---|---|---|---|
| 9 | 0 | 0.132 | 0.062 | 469.2 | 0.0019 | 0.0023 | 0.0021 | x | x |
| 10 | 1.0 | 0.131 | 0.063 | 469.5 | 0.0011 | 0.0013 | 0.0012 | x | x |
| 11 | 2.0 | 0.132 | 0.062 | 469.2 | 0.0007 | 0.0007 | 0.0007 | x | x |
| 12 | 3.0 | 0.131 | 0.063 | 469.4 | 0.0005 | 0.0005 | 0.0005 | ○ | ○ |
| 13 | 5.0 | 0.132 | 0.062 | 469.1 | 0.0004 | 0.0003 | 0.00035 | ○ | ○ |
| 14 | 7.5 | 0.133 | 0.060 | 468.7 | 0.0002 | 0.0002 | 0.0002 | ○ | ○ |
| 15 | 10.0 | 0.132 | 0.063 | 469.3 | 0.0002 | 0.0002 | 0.0002 | ○ | ○ |

(i) Evaluation on Sample Nos. 9 to 15 on the basis of Chromaticity y.

In the measurement samples with sample Nos. 9 to 11, because the diffusion member includes no diffusion material (that is, a transparent member) or the amount of the diffusion material is not appropriate, there was illumination unevenness.

In the measurement samples with sample Nos. 9 to 11, the average value β of the differences $\Delta y_1$ and $\Delta y_2$ between the maximum value and the minimum value of Δy was 30% or more of the average value β (=average value β') of the differences $\Delta y_1$ and $\Delta y_2$ between the maximum value and the minimum value of Δy of the measurement sample with sample No. 9 (measurement sample including a transparent member instead of the diffusion member).

In the measurement samples with sample Nos. 9 to 11, the average value β was 0.0006 or more.

Furthermore, in the measurement samples with sample Nos. 9 to 11, the average value β did not satisfy formula (1) below. That is, the average values β' and β were (0.0006$y_0$+0.0006) or more.

$$\beta < 0.0006 y_0 + 0.0006 \quad (1)$$

In the measurement samples with sample Nos. 12 to 15, because the amount of the diffusion material was appropriate, illumination unevenness was not recognized. In the measurement samples with sample Nos. 12 to 15, the average value β was less than 30% of the average value β (=average value β') of the measurement sample with sample No. 9.

In the measurement samples with sample Nos. 12 to 15, the average value β was less than 0.0006.

Furthermore, in the measurement samples with sample Nos. 12 to 15, the average value β satisfied formula (1) above.

The content disclosed in the present specification includes the following embodiments.

Aspect 1

A light-emitting device includes: a substrate; a wiring formed in the substrate; a light-emitting element including an electrode configured to be electrically connected to the wiring; and a diffusion member disposed on a light-emitting surface side of the light-emitting element on a side opposite to a surface on which the electrode is formed. The light-emitting element has a main wavelength in a range from 500 nm to 560 nm. A first direction parallel to one side of the diffusion member and a second direction orthogonal to the first direction are defined when the diffusion member is viewed in plan view. In each of a first measurement plane passing through a center of an outer shape of the diffusion member when viewed in plan view, being parallel to the first direction, and being perpendicular to a light emission surface of the diffusion member, and a second measurement plane passing through the center of the outer shape, is parallel to the second direction, and is perpendicular to the light emission surface of the diffusion member, in a range in which an angle at the center of the outer shape is in a range from −60° to 60° with reference to a perpendicular line passing through the center of the outer shape, being orthogonal to the light emission surface, and extending in a light emission observation direction, and when chromaticity x and chromaticity y of an emission color of the light-emitting device are measured, an average value a of a difference between a maximum value and a minimum value of a chromaticity difference Δx of the chromaticity x measured in the first measurement plane and a difference between a maximum value and a minimum value of a chromaticity difference Δx of the chromaticity x measured in the second measurement plane is less than 0.0024.

Aspect 2

A light-emitting device includes: a substrate; a wiring formed in the substrate; a light-emitting element including an electrode configured to be electrically connected to the wiring, and a diffusion member disposed on a light-emitting surface side of the light-emitting element on a side opposite to a surface on which the electrode is formed. The light-emitting element has a main wavelength in a range from 420 nm to 560 nm. A first direction parallel to one side of the diffusion member and a second direction orthogonal to the first direction are defined when the diffusion member is viewed in plan view. In each of a first measurement plane passing through a center of an outer shape of the diffusion member when viewed in plan view, being parallel to the first direction, and being perpendicular to a light emission surface of the diffusion member, and a second measurement plane passing through the center of the outer shape, being parallel to the second direction, and being perpendicular to the light emission surface of the diffusion member, in a range in which an angle at the center of the outer shape is in a range from −60° to 60° with reference to a perpendicular line passing through the center of the outer shape, being orthogonal to the light emission surface, and extending in a light emission observation direction, and when chromaticity x and chromaticity y of an emission color of the light-emitting device are measured, an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane is less than 30% of an average value β' obtained by measuring an emission color of a light-emitting device including a transparent member instead of the diffusion member.

Aspect 3

A light-emitting device includes: a substrate; a wiring formed in the substrate; a light-emitting element including an electrode configured to be electrically connected to the wiring; and a diffusion member disposed on a light-emitting surface side of the light-emitting element on a side opposite to a surface on which the electrode is formed. The light-emitting element has a main wavelength in a range from 420 nm to 560 nm. A first direction parallel to one side of the diffusion member and a second direction orthogonal to the first direction are defined when the diffusion member is viewed in plan view. In each of a first measurement plane passing through a center of an outer shape of the diffusion member when viewed in plan view, being parallel to the first direction, and being perpendicular to a light emission surface of the diffusion member, and a second measurement plane passing through the center of the outer shape, being parallel to the second direction, and being perpendicular to the light emission surface of the diffusion member, in a range in which an angle at the center of the outer shape is in a range from −60° to 60° with reference to a perpendicular line passing through the center of the outer shape, being orthogonal to the light emission surface, and extending in a light emission observation direction, and when chromaticity x and chromaticity y of an emission color of the light-emitting device are measured, an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane satisfies formula (1) below, $$\beta < 0.0006 y_0 + 0.0006 \quad (1)$$

in formula (1) above, $y_0$ is the chromaticity y of the emission color of the light-emitting device measured on the perpendicular line passing through the center of the outer shape, is orthogonal to the light emission surface, and extends in a light emission observation direction.

Aspect 4

A light-emitting device includes: a substrate; a wiring formed in the substrate; a light-emitting element including an electrode configured to be electrically connected to the wiring; and a diffusion member disposed on a light-emitting surface side of the light-emitting element on a side opposite to a surface on which the electrode is formed. The light-emitting element has a main wavelength in a range from 420 nm to 480 nm. A first direction parallel to one side of the diffusion member and a second direction orthogonal to the first direction are defined when the diffusion member is viewed in plan view. In each of a first measurement plane passing through a center of an outer shape of the diffusion member when viewed in plan view, being parallel to the first direction, and being perpendicular to a light emission surface of the diffusion member, and a second measurement plane passing through the center of the outer shape, being parallel to the second direction, and being perpendicular to the light emission surface of the diffusion member, in a range in which an angle at the center of the outer shape is in a range from −60° to 60° with reference to a perpendicular line passing through the center of the outer shape, being orthogonal to the light emission surface, and extending in a light emission observation direction, and when chromaticity x and chromaticity y of an emission color of the light-emitting device are measured, an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane is less than 0.006.

Aspect 5

The light-emitting device according to Aspect 1, wherein in measurement in each of the first measurement plane and the second measurement plane, the chromaticity x is in a range from 0.04 to 0.25 and the chromaticity y is in a range from 0.45 to 0.77. Aspect 6

The light-emitting device according to Aspect 2 or 3, wherein the light-emitting element has a main wavelength in a range from 420 nm to 480 nm.

Aspect 7

The light-emitting device according to any one of Aspects 2 to 4 and item 6, wherein in measurement in each of the first measurement plane and the second measurement plane, the chromaticity x is in a range from 0.04 to 0.25 and the chromaticity y is in a range from 0.01 to 0.77.

Aspect 8

The light-emitting device according to any one of Aspects 1 to 7, wherein the diffusion member includes a light-transmitting body and a diffusion layer disposed between the light-transmitting body and the light-emitting surface of the light-emitting element, and the diffusion layer includes resin and a particulate diffusion material disposed in the resin.

Aspect 9

The light-emitting device according to Aspect 8, wherein a concentration of the diffusion material in the diffusion layer is in a range from 0.1 mass % to 20 mass % when the resin is 100 mass %, and a particle size of the diffusion material is in a range from 0.1 μm to 2.0 μm.

Aspect 10

The light-emitting device according to Aspect 8 or 9, wherein the diffusion material is one or more selected from the group consisting of aluminum oxide, titanium oxide, and yttrium phosphate.

Aspect 11

The light-emitting device according to any one of Aspects 8 to 10, wherein the diffusion layer further includes a filler.

Aspect 12

The light-emitting device according to Aspect 11, wherein the filler is a particle of silicon oxide.

Aspect 13

A diffusion member is disposed on a light-emitting surface side of a light-emitting element to diffuse light from the light-emitting element. A first direction parallel to one side of the diffusion member and a second direction orthogonal to the first direction are defined when the diffusion member is viewed in plan view. The diffusion member is disposed on a light-emitting surface of a light-emitting element having a main wavelength of 523 nm to allow light from the light-emitting element to pass through the diffusion member. In each of a first measurement plane passing through a center of an outer shape of the diffusion member when viewed in plan view, being parallel to the first direction, and being perpendicular to a light emission surface of the diffusion member, and a second measurement plane passing through the center of the outer shape, being parallel to the second direction, and being perpendicular to the light emission surface of the diffusion member, in a range in which an angle at the center of the outer shape is in a range from −60° to 60° with reference to a perpendicular line passing through the center of the outer shape, being orthogonal to the light emission surface, and extending in a light emission observation direction, and when chromaticity x and chromaticity y of an emission color of the light passing through the diffusion member are measured, an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane is less than 30% of an average value β' obtained by measuring the emission color of the light from light-emitting element, the light passing through a transparent member disposed on the light-emitting surface of the light-emitting element instead of the diffusion member.

Aspect 14

The diffusion member according to Aspect 13, wherein the diffusion member includes a light-transmitting body and a diffusion layer disposed between the light-transmitting body and the light-emitting surface of the light-emitting element, and the diffusion layer includes resin and a particulate diffusion material disposed in the resin.

Aspect 15

The diffusion member according to Aspect 14, wherein a concentration of the diffusion material in the diffusion layer is in a range from 0.1 mass % to 20 mass % when the resin is 100 mass %, and a particle size of the diffusion material is in a range from 0.1 μm to 2.0 μm.

Aspect 16

The diffusion member according to Aspect 14 or 15, wherein the diffusion material is one or more selected from the group consisting of aluminum oxide, titanium oxide, and yttrium phosphate.

Aspect 17

The diffusion member according to any one of Aspects 14 to 16, wherein the diffusion layer further includes a filler.

Aspect 18

The diffusion member according to Aspect 17, wherein the filler is a particle of silicon oxide.

REFERENCE SIGNS LIST

1 Substrate; 2 Light-emitting element; 21 Electrode of light-emitting element; 23 Light-emitting surface of light-emitting element; 30 Diffusion member; 30a First side; 30b Second side; 3 Diffusion layer; 31 Resin of diffusion layer; 33 Light emission surface of diffusion member; 3A Resin paste; 4 Light-transmitting body; 5 Adhesive layer; 6 Covering Member; 7 Conductive member; 8 Semiconductor element; 9 Diffusion material; 11 Wiring; 12 Cutting line; 13 Peripheral edge of diffusion layer; and 100 Light-emitting device.

The invention claimed is:

1. A light-emitting device comprising:
a substrate;
a wiring formed in the substrate;
a light-emitting element including an electrode electrically connected to the wiring, and configured to emit light having a main wavelength in a range from 500 nm to 560 nm; and
a diffusion member disposed on a light-emitting surface side of the light-emitting element on a side opposite to a surface on which the electrode is formed, wherein
a first direction parallel to one side of the diffusion member and a second direction orthogonal to the first direction are defined when the diffusion member is viewed in plan view,
a first measurement plane is defined as a plane passing through a center of an outer shape of the diffusion member when viewed in plan view, parallel to the first direction, and perpendicular to a light emission surface of the diffusion member, and
a second measurement plane is defined as a plane passing through the center of the outer shape, parallel to the second direction, and perpendicular to the light emission surface of the diffusion member,
when chromaticity x and chromaticity y of an emission color of the light-emitting device are measured in each of the first measurement plane and the second measurement plane in a range in which an angle at the center of the outer shape is in a range from −60° to 60° with reference to a perpendicular line passing through the center of the outer shape, being orthogonal to the light emission surface, and extending in a light emission observation direction,
an average value α of a difference between a maximum value and a minimum value of a chromaticity difference Δx of the chromaticity x measured in the first measurement plane and a difference between a maximum value and a minimum value of a chromaticity difference Δx of the chromaticity x measured in the second measurement plane is less than 0.0024.

2. A light-emitting device comprising:
a substrate;
a wiring formed in the substrate;
a light-emitting element including an electrode electrically connected to the wiring, and configured to emit light having a main wavelength in a range from 420 nm to 560 nm, and
a diffusion member disposed on a light-emitting surface side of the light-emitting element on a side opposite to a surface on which the electrode is formed, wherein
a first direction parallel to one side of the diffusion member and a second direction orthogonal to the first direction are defined when the diffusion member is viewed in plan view,
a first measurement plane is defined as a plane passing through a center of an outer shape of the diffusion member when viewed in plan view, parallel to the first direction, and perpendicular to a light emission surface of the diffusion member, and a second measurement plane is defined as a plane passing through the center of the outer shape, parallel to the second direction, and perpendicular to the light emission surface of the diffusion member, when chromaticity x and chromaticity y of an emission color of the light-emitting device are measured in each of the first measurement plane and the second measurement plane in a prescribed range in which an angle at the center of the outer shape is in a range from −60° to 60° with reference to a perpendicular line passing through the center of the outer shape, being orthogonal to the light emission surface, and extending in a light emission observation direction, an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane is less than 30% of an average value β' obtained by measuring an emission color of a light-emitting device including a transparent member instead of the diffusion member.

3. A light-emitting device comprising:
a substrate;
a wiring formed in the substrate;
a light-emitting element including an electrode electrically connected to the wiring, and configured to emit light having a main wavelength in a range from 420 nm to 560 nm, and
a diffusion member disposed on a light-emitting surface side of the light-emitting element on a side opposite to a surface on which the electrode is formed, wherein
a first direction parallel to one side of the diffusion member and a second direction orthogonal to the first direction are defined when the diffusion member is viewed in plan view,
a first measurement plane is defined as a plane passing through a center of an outer shape of the diffusion member when viewed in plan view, parallel to the first direction, and perpendicular to a light emission surface of the diffusion member, and
a second measurement plane is defined as a plane passing through the center of the outer shape, parallel to the second direction, and perpendicular to the light emission surface of the diffusion member, when chromaticity x and chromaticity y of an emission color of the light-emitting device are measured in each of the first measurement plane and the second measurement plane in a range in which an angle at the center of the outer shape is in a range from −60° to 60° with reference to a perpendicular line passing through the center of the outer shape, being orthogonal to the light emission surface, and extending in a light emission observation direction, emitting device are measured, an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane satisfies formula (1) below, $$<0.0006 y_0 + 0.0006 \qquad (1)$$

in formula (1) above, $y_0$ is the chromaticity y of the emission color of the light-emitting device measured on the perpendicular line passing through the center of the outer shape, being orthogonal to the light emission surface, and extending in a light emission observation direction.

4. A light-emitting device comprising:
a substrate;
a wiring formed in the substrate;
a light-emitting element including an electrode electrically connected to the wiring, and configured to emit light having a main wavelength in a range from 420 nm to 480 nm; and
a diffusion member disposed on a light-emitting surface side of the light-emitting element on a side opposite to a surface on which the electrode is formed, wherein
a first direction parallel to one side of the diffusion member and a second direction orthogonal to the first direction are defined when the diffusion member is viewed in plan view,
a first measurement plane is defined as a plane passing through a center of an outer shape of the diffusion member when viewed in plan view, parallel to the first direction, and perpendicular to a light emission surface of the diffusion member, and a second measurement plane is defined as a plane passing through the center of the outer shape, parallel to the second direction, and perpendicular to the light emission surface of the diffusion member, when chromaticity x and chromaticity y of an emission color of the light-emitting device are measured in each of the first measurement plane and the second measurement plane in a range in which an angle at the center of the outer shape is in a range from −60° to 60° with reference to a perpendicular line passing through the center of the outer shape, being orthogonal to the light emission surface, and extending in a light emission observation direction, an average value β of a difference between a maximum value and a minimum value of a chromaticity difference Δy of the chromaticity y measured in the first measurement plane and a difference between a maximum value and a minimum value of a chromaticity difference Δy of the chromaticity y measured on the second measurement plane is less than 0.0006.

5. The light-emitting device according to claim 1, wherein in each of the first measurement plane and the second measurement plane, the chromaticity x is in a range from 0.04 to 0.25 and the chromaticity y is in a range from 0.45 to 0.77.

6. The light-emitting device according to claim 2, wherein the light-emitting element is configured to emit light having the main wavelength in a range from 420 nm to 480 nm.

7. The light-emitting device according to claim 2, wherein in the prescribed range in each of the first measurement plane and the second measurement plane, the chromaticity x is in a range from 0.04 to 0.25 and the chromaticity y is in a range from 0.01 to 0.77.

8. The light-emitting device according to claim 1, wherein the diffusion member includes a light-transmitting body and a diffusion layer disposed between the light-transmitting body and the light-emitting surface of the light-emitting element, and
the diffusion layer includes resin and a particulate diffusion material disposed in the resin.

9. The light-emitting device according to claim 8, wherein
- a concentration of the diffusion material in the diffusion layer is in a range from 0.1 mass % to 20 mass % when the resin is 100 mass %, and
- a particle size of the particulate diffusion material is in a range from 0.1 μm to 2.0 μm.

10. The light-emitting device according to claim 8, wherein
- the diffusion material includes one or more materials selected from the group consisting of aluminum oxide, titanium oxide, and yttrium phosphate.

11. The light-emitting device according to claim 8, wherein
- the diffusion layer further includes a filler.

12. The light-emitting device according to claim 11, wherein
- the filler includes particles silicon oxide.

13. A diffusion member configured to diffuse light from a light-emitting element configured to emit light having a main wavelength of 523 nm, the diffusion member comprising:
- a surface configured to face a light-emitting surface of the light-emitting element when the diffusion member is disposed on the light-emitting element to allow light from the light-emitting element to pass through the diffusion member; and
- one side parallel to a first direction when the diffusion member is viewed in plan view, wherein
- a first measurement plane is defined as a plane passing through a center of an outer shape of the diffusion member when viewed in plan view, parallel to the first direction, and perpendicular to a light emission surface of the diffusion member, and
- a second measurement plane is defined as a plane passing through the center of the outer shape, being parallel to a second direction orthogonal to the first direction, and perpendicular to the light emission surface of the diffusion member,
- when chromaticity x and chromaticity y of an emission color of the light passing through the diffusion member are measured in each of the first measurement plane and the second measurement plane in a range in which an angle at the center of the outer shape is in a range from −60° to 60° with reference to a perpendicular line passing through the center of the outer shape, being orthogonal to the light emission surface, and extending in a light emission observation direction,
- an average value β of a difference between a maximum value and a minimum value of a chromaticity difference Δy of the chromaticity y measured in the first measurement plane and a difference between a maximum value and a minimum value of a chromaticity difference Δy of the chromaticity y measured in the second measurement plane is less than 30% of an average value β' obtained by measuring the emission color of the light from light-emitting element, the light passing through a transparent member disposed on the light-emitting surface of the light-emitting element instead of the diffusion member.

14. The diffusion member according to claim 13, wherein
- the diffusion member includes a light-transmitting body and a diffusion layer disposed between the light-transmitting body and the light-emitting surface of the light-emitting element, and
- the diffusion layer includes resin and a particulate diffusion material disposed in the resin.

15. The diffusion member according to claim 14, wherein
- a concentration of the diffusion material in the diffusion layer is in a range from 0.1 mass % to 20 mass % when the resin is 100 mass %, and
- a particle size of the particulate diffusion material is in a range from 0.1 μm to 2.0 μm.

16. The diffusion member according to claim 14, wherein
- the diffusion material includes one or more materials selected from the group consisting of aluminum oxide, titanium oxide, and yttrium phosphate.

17. The diffusion member according to claim 14, wherein
- the diffusion layer further includes a filler.

18. The diffusion member according to claim 17, wherein
- the filler includes particles silicon oxide.

* * * * *